(12) United States Patent
Manabe et al.

(10) Patent No.: US 11,393,821 B1
(45) Date of Patent: Jul. 19, 2022

(54) SEMICONDUCTOR DEVICE AND MANUFACTURING METHOD THEREOF

(71) Applicant: Winbond Electronics Corp., Taichung (TW)

(72) Inventors: Kazutaka Manabe, Kanagawa (JP); Hung-Yu Wei, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/141,182

(22) Filed: Jan. 4, 2021

(51) Int. Cl.
*H01L 27/108* (2006.01)

(52) U.S. Cl.
CPC .. *H01L 27/10805* (2013.01); *H01L 27/10855* (2013.01); *H01L 27/10897* (2013.01)

(58) Field of Classification Search
None
See application file for complete search history.

(56) References Cited

U.S. PATENT DOCUMENTS

| | | |
|---|---|---|
| 6,194,757 B1 | 2/2001 | Shinkawata |
| 7,510,963 B2 | 3/2009 | Yang et al. |
| 10,366,941 B2 * | 7/2019 | Liu .................... H01L 24/14 |
| 2013/0183805 A1 * | 7/2013 | Wong ............. H01L 27/10867 438/387 |
| 2020/0176455 A1 * | 6/2020 | Kim ............... H01L 27/10814 |
| 2020/0219886 A1 * | 7/2020 | Sills ............... H01L 21/76897 |

FOREIGN PATENT DOCUMENTS

| | | |
|---|---|---|
| CN | 109148427 | 1/2019 |
| TW | 201904077 | 1/2019 |
| TW | 201917830 | 5/2019 |

OTHER PUBLICATIONS

"Office Action of Taiwan Counterpart Application", dated Sep. 2, 2021, p. 1-p. 6.

* cited by examiner

*Primary Examiner* — Steven M Christopher
(74) *Attorney, Agent, or Firm* — JCIPRNET

(57) ABSTRACT

A semiconductor device including a substrate and a capacitor is provided. The substrate includes a memory array region. The capacitor is located in the memory array region. The capacitor includes a first electrode, a second electrode, and an insulating layer. The first electrode is located on the substrate. The second electrode includes a first conductive layer and a metal layer. The first conductive layer is located on the first electrode. The metal layer is located on the first conductive layer. The metal layer exposes a portion of the first conductive layer. The insulating layer is located between the first electrode and the second electrode.

19 Claims, 30 Drawing Sheets

SEMICONDUCTOR DEVICE AND MANUFACTURING METHOD THEREOF

BACKGROUND OF THE INVENTION

Field of the Invention

The invention relates to a semiconductor device and a manufacturing method thereof, and particularly relates to a semiconductor device having a capacitor and a manufacturing method thereof.

Description of Related Art

Currently, in the manufacturing process of semiconductor devices, the hydrogen sintering ($H_2$ sintering) treatment is used to reduce dangling bonds to improve the electrical performance of the semiconductor device. In some semiconductor devices (such as dynamic random access memory (DRAM)), the upper electrode of the capacitor includes the boron-doped silicon germanium (B-doped SiGe) layer and the tungsten layer, wherein the tungsten layer can be used as an etching stop layer in the process of forming the contact. However, during the hydrogen sintering treatment, the tungsten layer will form a strong barrier for hydrogen penetration into the silicon substrate, which hinders the hydrogen sintering treatment and reduces the electrical performance of the semiconductor device.

The current solution is to omit the tungsten layer in the upper electrode, so that the hydrogen sintering treatment can be performed smoothly. As a result, the thickness of the boron-doped silicon germanium layer must be increased due to the lack of the tungsten layer as an etching stop layer in the process of forming the contact. However, the thicker boron-doped silicon germanium layer has poor uniformity between different memory array regions, thereby reducing the electrical performance of the semiconductor device. In addition, if the tungsten layer in the upper electrode is omitted, the resistance between the contact and the upper electrode will increase, and the unevenness of the contact hole during etching will be increased, thereby reducing the electrical performance of the semiconductor device.

SUMMARY OF THE INVENTION

The invention provides a semiconductor device and a manufacturing method thereof, which can improve the electrical performance of the semiconductor device.

The invention provides a semiconductor device, which includes a substrate and a capacitor. The substrate includes a memory array region. The capacitor is located in the memory array region. The capacitor includes a first electrode, a second electrode, and an insulating layer. The first electrode is located on the substrate. The second electrode includes a first conductive layer and a metal layer. The first conductive layer is located on the first electrode. The metal layer is located on the first conductive layer. The metal layer exposes a portion of the first conductive layer. The insulating layer is located between the first electrode and the second electrode.

The invention provides a manufacturing method of a semiconductor device, which includes the following steps. A substrate is provided. The substrate includes a memory array region. A capacitor is formed in the memory array region. The method of forming the capacitor includes the following steps. A first electrode is formed on the substrate of the memory array region. An insulating layer is formed on the first electrode. A second electrode is formed on the insulating layer. The method of forming the second electrode includes the following steps. A first conductive layer is formed on the insulating layer. A metal layer is formed on the first conductive layer. The metal layer exposes a portion of the first conductive layer.

Based on the above description, in the semiconductor device and the manufacturing method thereof according to the invention, since the metal layer exposes the first conductive layer, that is, the metal layer does not completely cover the first conductive layer, the subsequent hydrogen sintering treatment can be smoothly performed to improve the electrical performance of the semiconductor device. In addition, since the metal layer can be used as an etching stop layer in the subsequent contact formation process, there is no need to increase the thickness of the first conductive layer. In this way, the first conductive layer can have better uniformity between different memory array regions, thereby effectively improving the electrical performance of the semiconductor device. Furthermore, the subsequently formed contact can be electrically connected to the metal layer in the second electrode, so that the resistance between the contact and the second electrode can be reduced, thereby improving the electrical performance of the semiconductor device.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
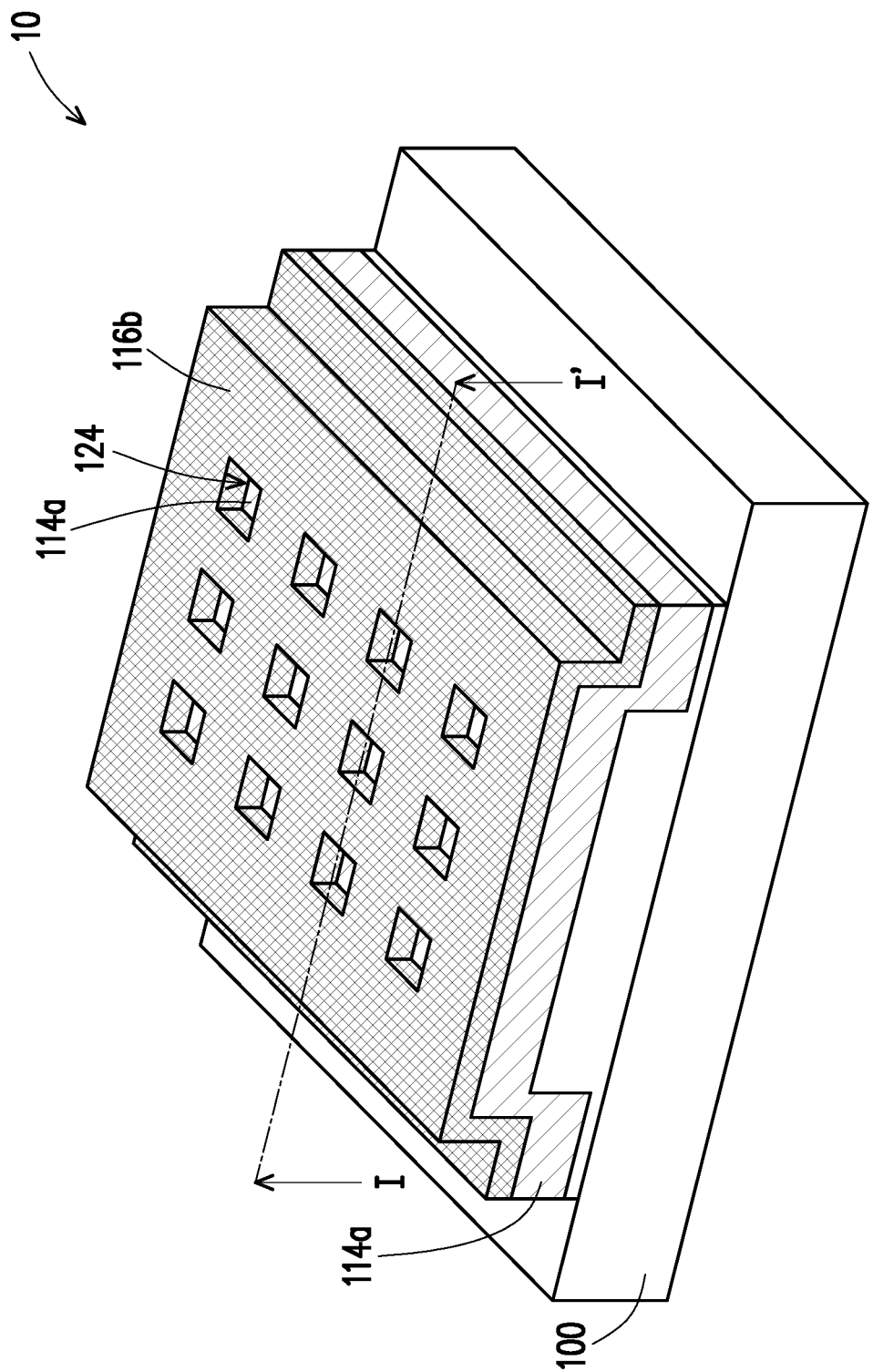
FIG. 1 is a perspective view illustrating a semiconductor device according to an embodiment of the invention.

FIG. 1 is a perspective view illustrating a semiconductor device according to an embodiment of the invention. FIG. 2A to FIG. 2G are cross-sectional views illustrating the manufacturing process of the semiconductor device taken along section line I-I' in FIG. 1. In FIG. 1, some components in FIG. 2A to FIG. 2G are omitted to clearly illustrate the arrangement relationship between the components in FIG. 1.

Figure 2A:
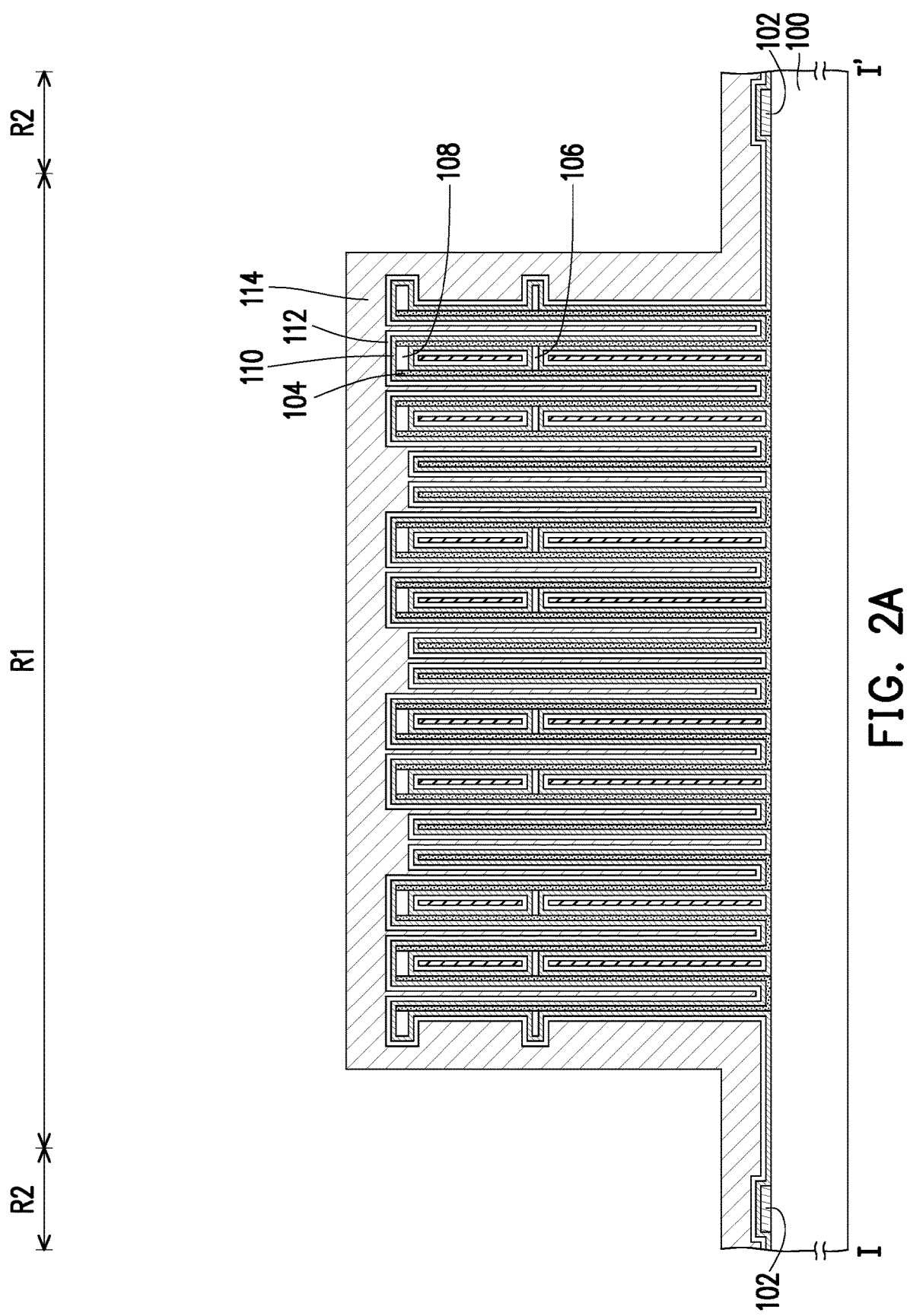
FIG. 2A to FIG. 2G are cross-sectional views illustrating the manufacturing process of the semiconductor device taken along section line I-I' in FIG. 1.

Referring to FIG. 2A, a substrate 100 is provided. The substrate 100 may be a semiconductor substrate such as a silicon substrate. The substrate 100 may include a memory array region R1 and a peripheral circuit region R2. In addition, depending on the type of semiconductor device, there may be corresponding device on the substrate 100. In the present embodiment, the semiconductor device is, for example, a dynamic random access memory (DRAM). In this case, there may be a corresponding transistor (not shown) on the substrate 100 in the memory array region R1, and there may be a corresponding active device (e.g., a sense amplifier) (not shown) and an interconnect structure 102 electrically connected to the active device on the substrate 100 in the peripheral circuit region R2. In some embodiments, there may be an etching stop layer (not shown) on the interconnect structure 102. Furthermore, there may be a required dielectric layer (not shown) and other interconnect structures (not shown), etc. on the substrate 100, there may be a required component (e.g., an isolation structure or a doped region) in the substrate 100, and the description thereof is omitted here.

An electrode 104 is formed on the substrate 100 of the memory array region R1. The electrode 104 may be electrically connected to the corresponding transistor on the substrate 100. The material of the electrode 104 is, for example, titanium, titanium nitride, or a combination thereof. In some embodiments, after the electrode 104 is formed, the dielectric layer 106 and the dielectric layer 108 may be remained. The material of the dielectric layer 106 and the dielectric layer 108 is, for example, silicon nitride. An insulating material layer 110 may be conformally formed on the electrode 104. The material of the insulating material layer 110 may be a dielectric material such as a high-k material. A conductive material layer 112 may be conformally formed on the insulating material layer 110. The material of the conductive material layer 112 is, for example, titanium, titanium nitride, or a combination thereof. A conductive material layer 114 may be formed on the conductive material layer 112. The material of the conductive material layer 114 is, for example, a doped semiconductor material, such as a boron-doped silicon germanium layer (BSiGe) or doped polysilicon.

Figure 2B:
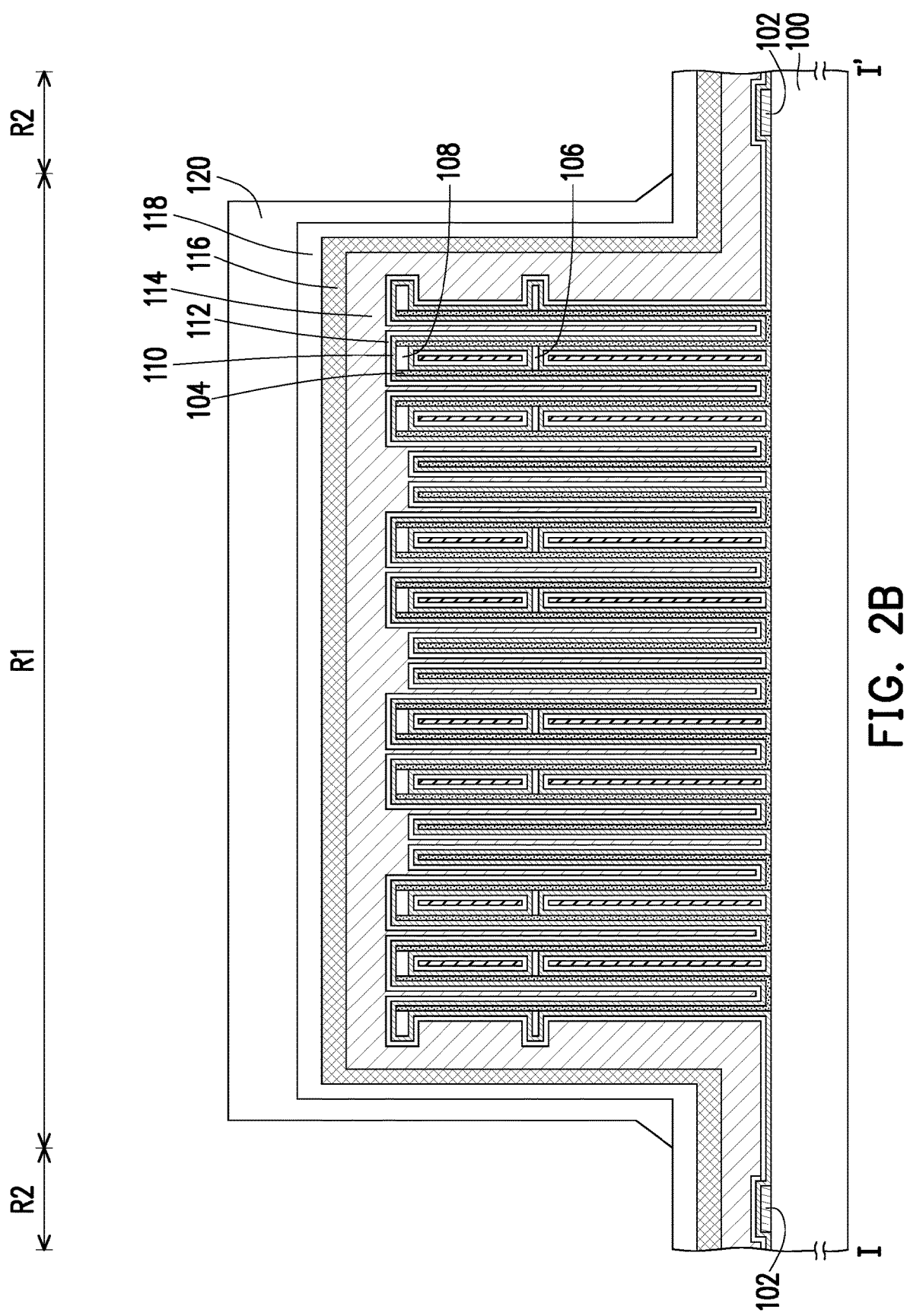

Referring to FIG. 2B, a metal material layer 116 may be formed directly on the conductive material layer 114. The material of the metal material layer 116 is, for example, metal such as tungsten. A dielectric layer 118 may be formed on the metal material layer 116. The material of the dielectric layer 118 is, for example, silicon oxide such as tetraethyl orthosilicate (TEOS) silicon oxide. A patterned photoresist layer 120 may be formed on the dielectric layer 118. The patterned photoresist layer 120 may expose a portion of the dielectric layer 118 located in the peripheral circuit region R2.

Figure 2C:
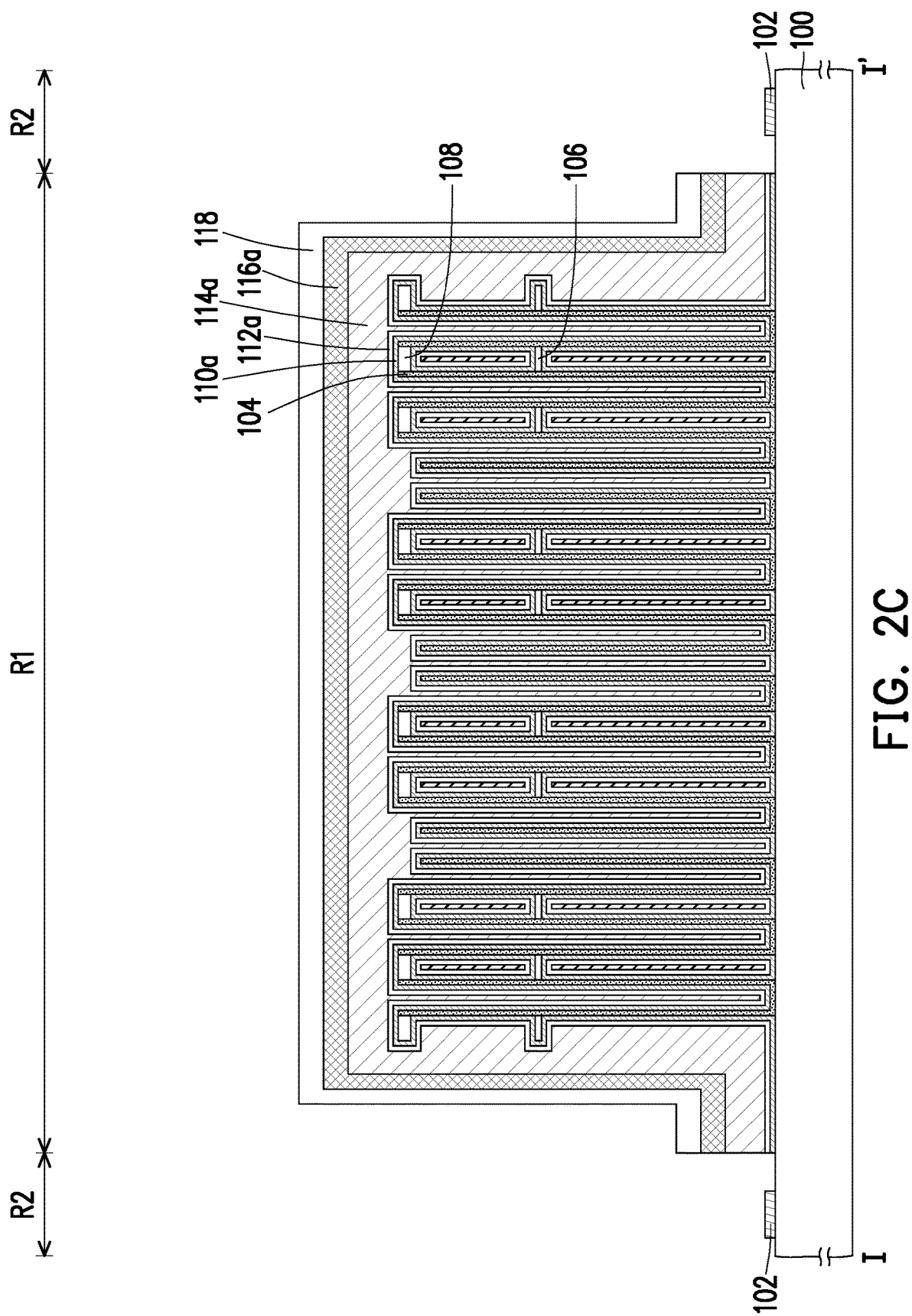

Referring to FIG. 2C, a portion of the dielectric layer 118, a portion of the metal material layer 116, a portion of the conductive material layer 114, a portion of the conductive material layer 112, and a portion of the insulating material layer 110 located in the peripheral circuit region R2 are removed by using the patterned photoresist layer 120 as a mask, thereby forming an insulating layer 110a on the electrode 104, forming a conductive layer 112a on the insulating layer 110a, forming a conductive layer 114a on the conductive layer 112a, and forming a metal material layer 116a on the conductive layer 114a. Then, the patterned photoresist layer 120 is removed.

Figure 2D:
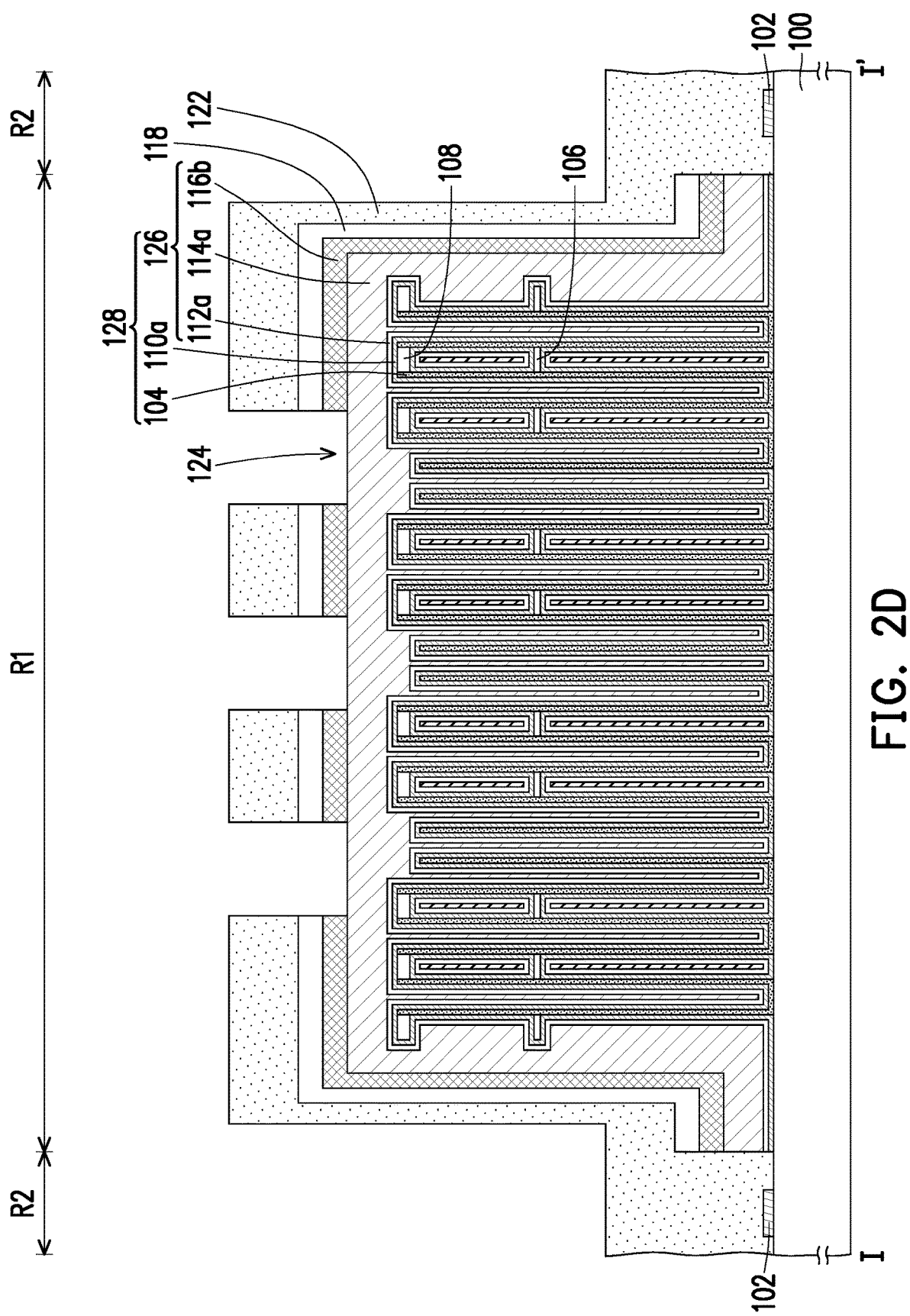

Referring to FIG. 2D, a patterned photoresist layer 122 may be formed. A portion of the dielectric layer 118 and a portion of the metal material layer 116a are removed by using the patterned photoresist layer 122 as a mask. Thereby, a patterning process may be performed on the metal material layer 116a to form a metal layer 116b exposing a portion of the conductive layer 114a. In this way, the metal layer 116b may be formed on the conductive layer 114a. For example, after performing the above process, the metal layer 116b may have at least one opening 124, and the opening 124 exposes a portion of the conductive layer 114a.

Through the above processes, an electrode 126 may be formed on the insulating layer 110a, and a capacitor 128 may be formed in the memory array region R1, but the manufacturing method of the capacitor 128 of the invention is not limited thereto. The capacitor 128 may be a cylinder capacitor, but the invention is not limited thereto. The electrode 126 may include the conductive layer 114a, the metal layer 116b, and the conductive layer 112a. The capacitor 128 may include the electrode 104, the electrode 126, and the insulating layer 110a.

Figure 2E:
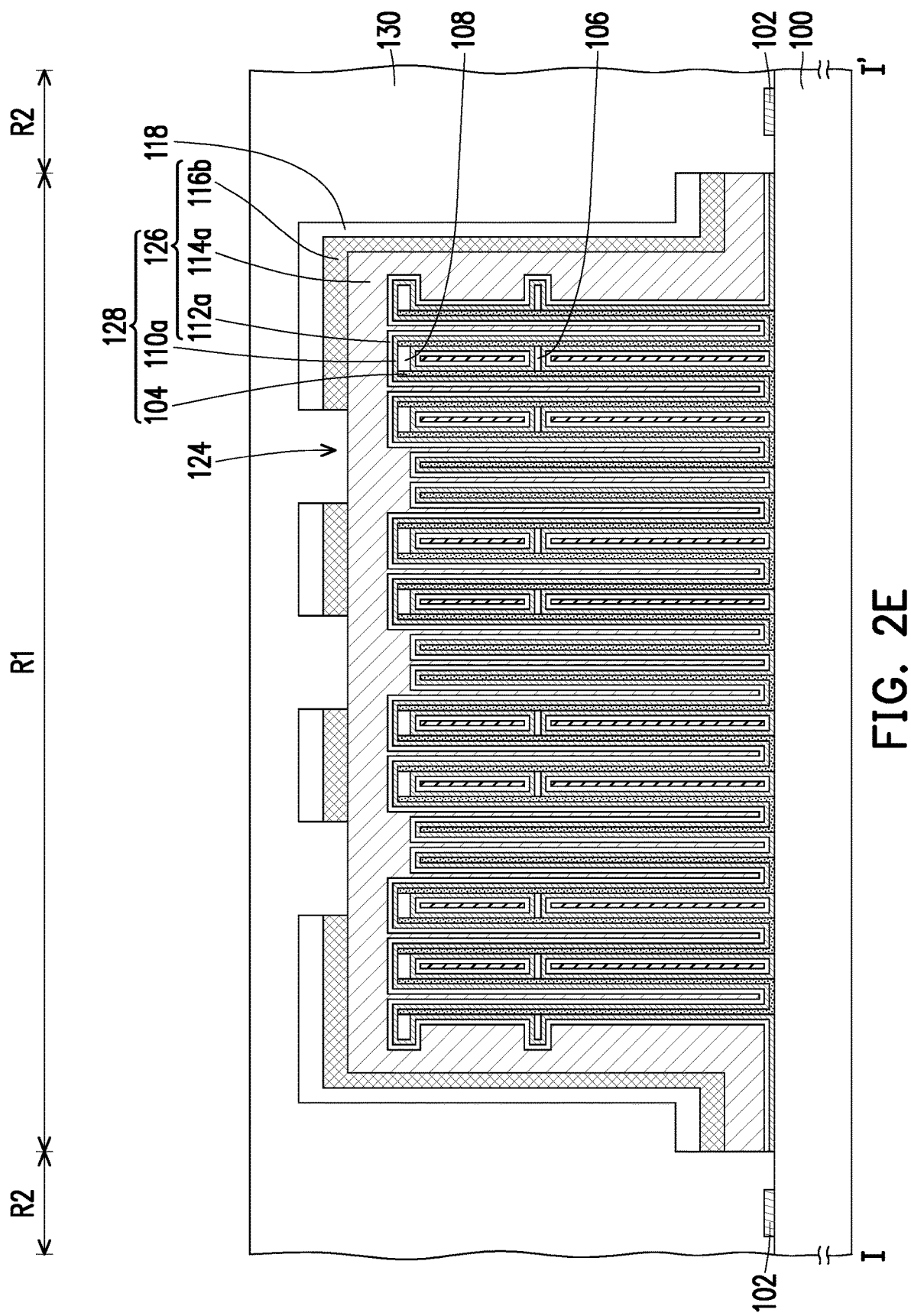

Referring to FIG. 2E, the patterned photoresist layer 122 may be removed. A dielectric layer 130 may be formed in the memory array region R1 and the peripheral circuit region R2, and the dielectric layer 130 may fill the opening 124. The dielectric layer 130 may have a flat upper surface. The material of the dielectric layer 130 is, for example, silicon oxide, such as tetraethyl orthosilicate (TEOS) silicon oxide. The formation method of the dielectric layer 130 is, for example, depositing a dielectric material layer, and then using an etching process and/or a chemical mechanical polishing process to planarize the dielectric material layer, but the invention is not limited thereto.

Figure 2F:
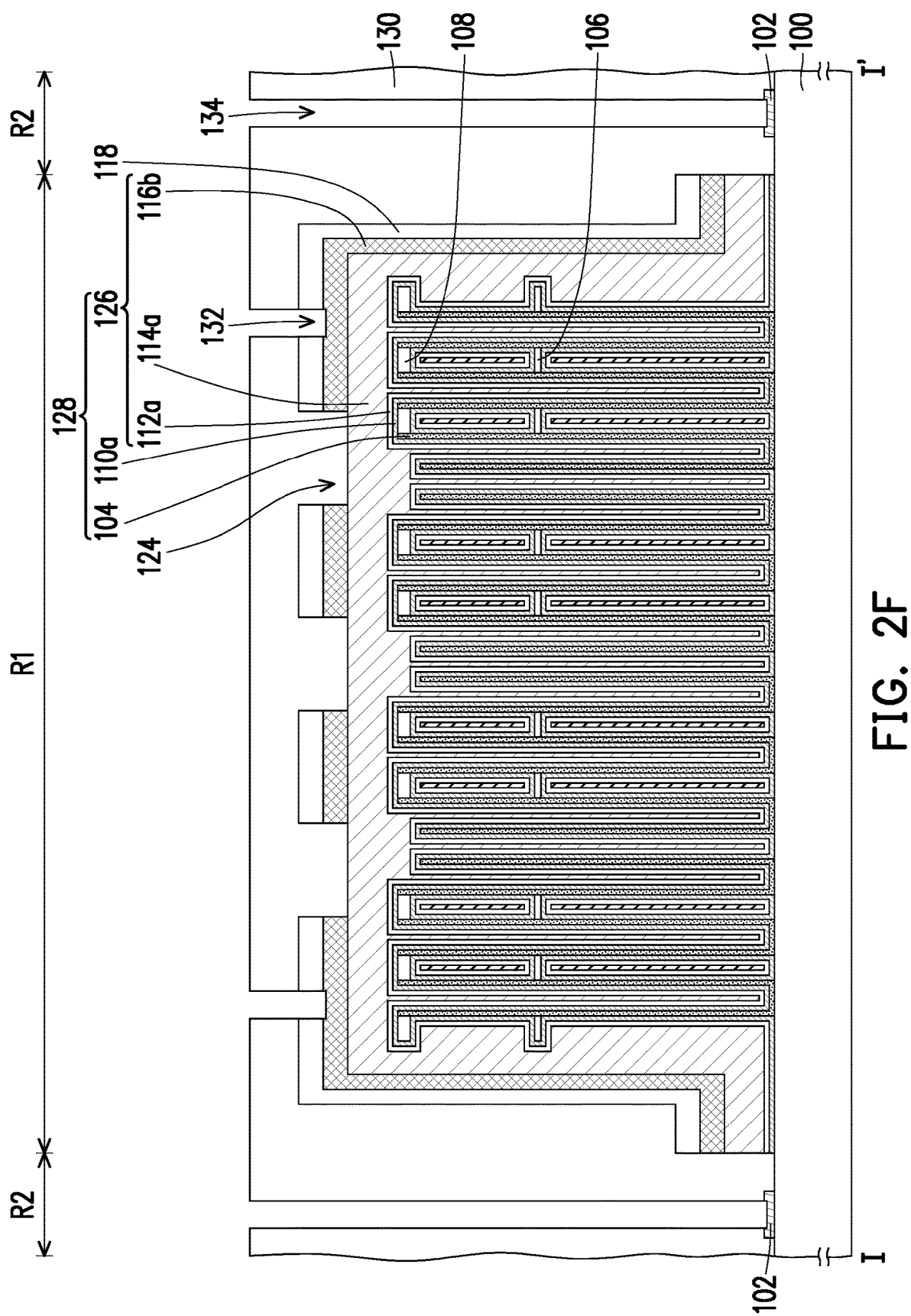

Referring to FIG. 2F, an opening 132 exposing the capacitor 128 may be formed in the dielectric layer 130 and the dielectric layer 118 of the memory array region R1, and an opening 134 exposing the interconnect structure 102 may be formed in the dielectric layer 130 of the peripheral circuit region R2. For example, the opening 132 may expose the metal layer 116b in the capacitor 128. The forming method of the opening 132 and the opening 134 is, for example, patterning the dielectric layer 130 and the dielectric layer 118 by a lithography process and an etching process. In some embodiments, a patterned hard mask layer (not shown) may be used as a mask for forming the opening 132 and the opening 134. In the etching process for forming the opening 132 and the opening 134, since the etching rate of the metal layer 116b in the etching process is much lower than the etching rate of the dielectric layer 130 in the etching process, the opening 132 and the opening 134 may be formed sequentially by the etching process, and the etching process may smoothly stop on the metal layer 116b exposed by the opening 132 and on the interconnect structure 102 exposed by the opening 134. In addition, the interconnect structure 102 and the metal layer 116b may be the same material. Furthermore, during the etching process for forming the opening 132 and the opening 134, a portion of the interconnect structure 102 and a portion of the metal layer 116b may be removed.

Figure 2G:
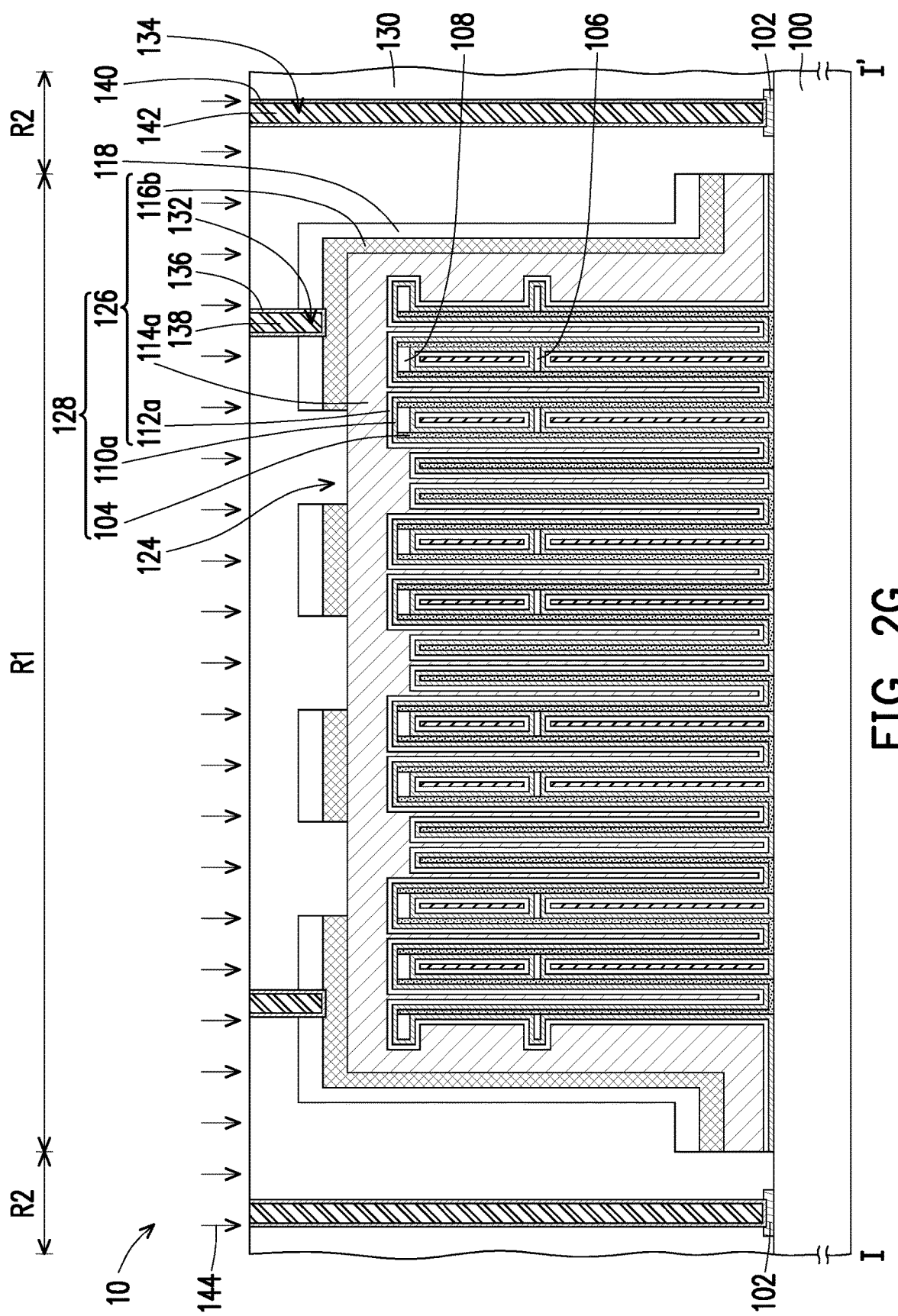

Referring to FIG. 2G, a barrier layer 136 and a contact 138 electrically connected to the metal layer 116b may be formed in the opening 132, and a barrier layer 140 and a contact 142 electrically connected to the interconnect structure 102 may be formed in the opening 134. The material of the barrier layer 136 and the barrier layer 140 is, for example, titanium, titanium nitride, or a combination thereof. The material of the contact 138 and the contact 142 is, for example, tungsten. In other embodiments, the barrier layer 136 and the barrier layer 140 may be omitted.

Then, a hydrogen sintering treatment 144 may be performed, so that the dangling bonds on the substrate 100 can be reduced, thereby improving the electrical performance of the semiconductor device. In some embodiments, the hydrogen sintering treatment 144 may be performed after performing the back-end-of-line (BEOL) process.

Hereinafter, the semiconductor device 10 of the above embodiment will be described with reference to FIG. 1 and FIG. 2G. In addition, although the method of forming the semiconductor device 10 is described by taking the above method as an example, the invention is not limited thereto.

Referring to FIGS. 1 and 2G, the semiconductor device 10 includes the substrate 100 and the capacitor 128. The substrate 100 may include the memory array region R1 and the peripheral circuit region R2. There is the interconnect structure 102 in the peripheral circuit region R2. The capacitor 128 is located in the memory array region R1 and includes the electrode 104, the electrode 126, and the insulating layer 110a. The electrode 104 is located on the substrate 100. The electrode 126 includes the conductive layer 114a and the metal layer 116b. The conductive layer 114a is located on the electrode 104. The metal layer 116b is located on the conductive layer 114a. The metal layer 116b may be in direct contact with the conductive layer 114a. The metal layer 116b exposes a portion of the conductive layer 114a. For example, the metal layer 116b may expose a portion of the top surface of the conductive layer 114a. In addition, the metal layer 116b may be located on the top surface and the side surface of the conductive layer 114a. The insulating layer 110a is located between the electrode 104 and the electrode 126. Furthermore, the electrode 126 may further include the conductive layer 112a. The conductive layer 112a is located between the conductive layer 114a and the insulating layer 110a.

Moreover, the semiconductor device 10 may further include at least one of the dielectric layer 118, the dielectric layer 130, the barrier layer 136, the contact 138, the barrier layer 140, and the contact 142. The dielectric layer 118 is located on the metal layer 116b. The dielectric layer 130 covers the capacitor 128 and the interconnect structure 102. The barrier layer 136 and the contact 138 are located in the memory array region R1 and electrically connected to the metal layer 116b. The barrier layer 136 may be located in the opening 132, and the contact 138 may be located on the barrier layer 136 in the opening 132. The barrier layer 140 and the contact 142 are located in the peripheral circuit region R2 and electrically connected to the interconnect structure 102. The barrier layer 140 may be located in the opening 134, and the contact 142 may be located on the barrier layer 140 in the opening 134. The top view shape of the contact 138 and the contact 142 may be a polygon (e.g., a rectangle), an ellipse, a circle, or a combination thereof.

Figure 3A:
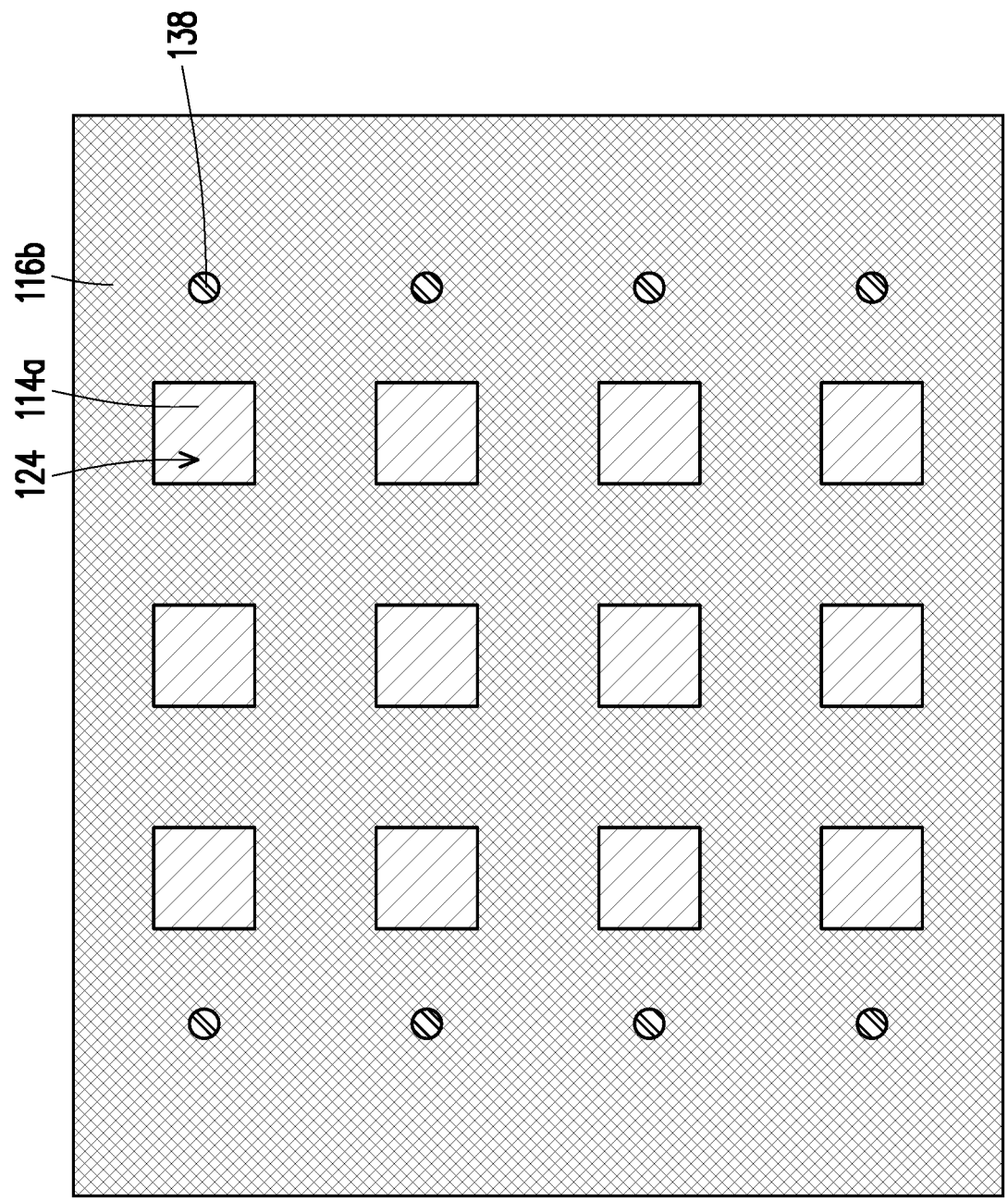
FIG. 3A is a top view illustrating the metal layer, the contact, and the conductive layer in FIG. 2G.
Figure 3B:
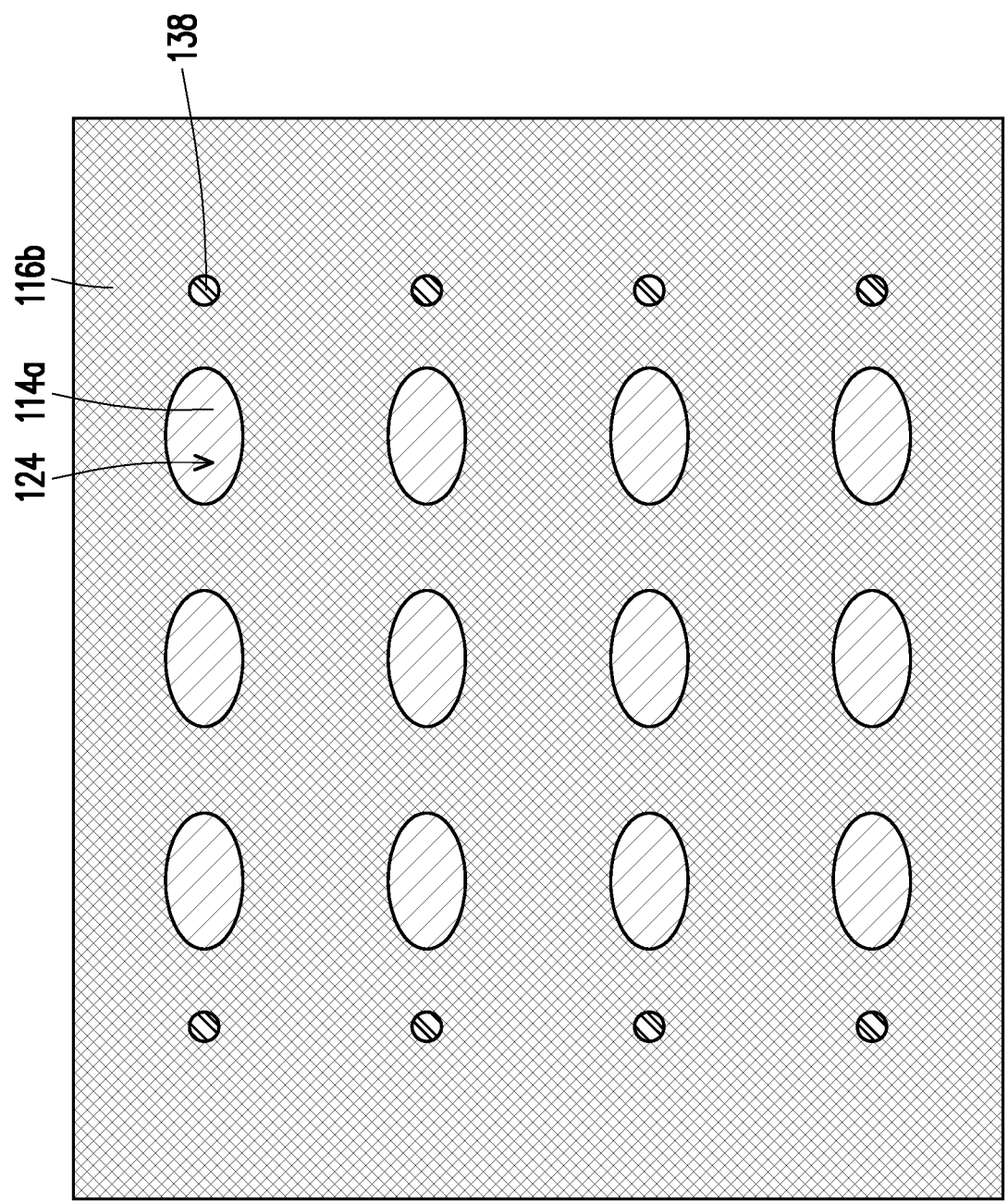
FIG. 3B to FIG. 3G are top views illustrating the metal layer, the contact, and the conductive layer according to other embodiments of the invention.
Figure 3C:
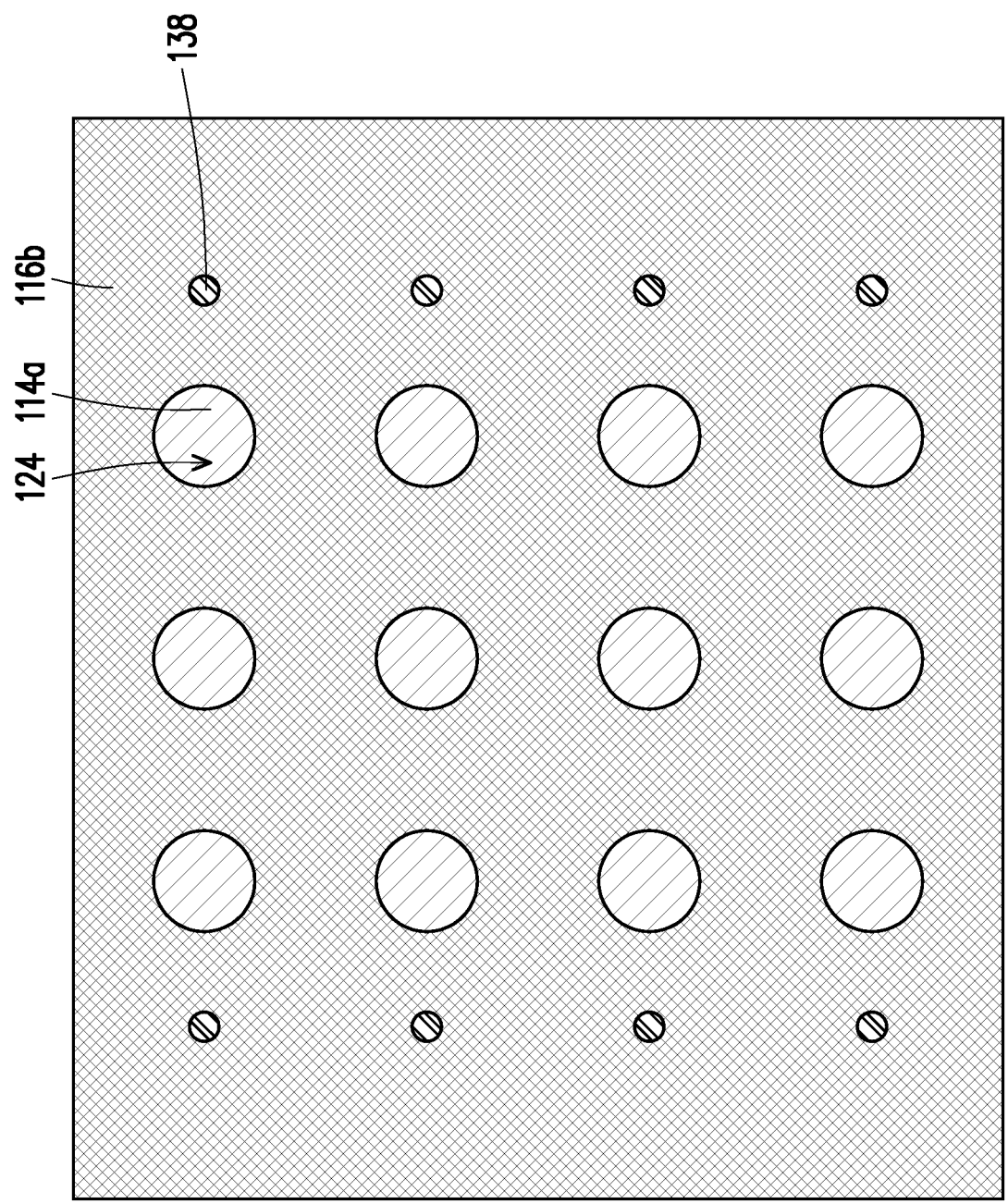
Figure 3D:
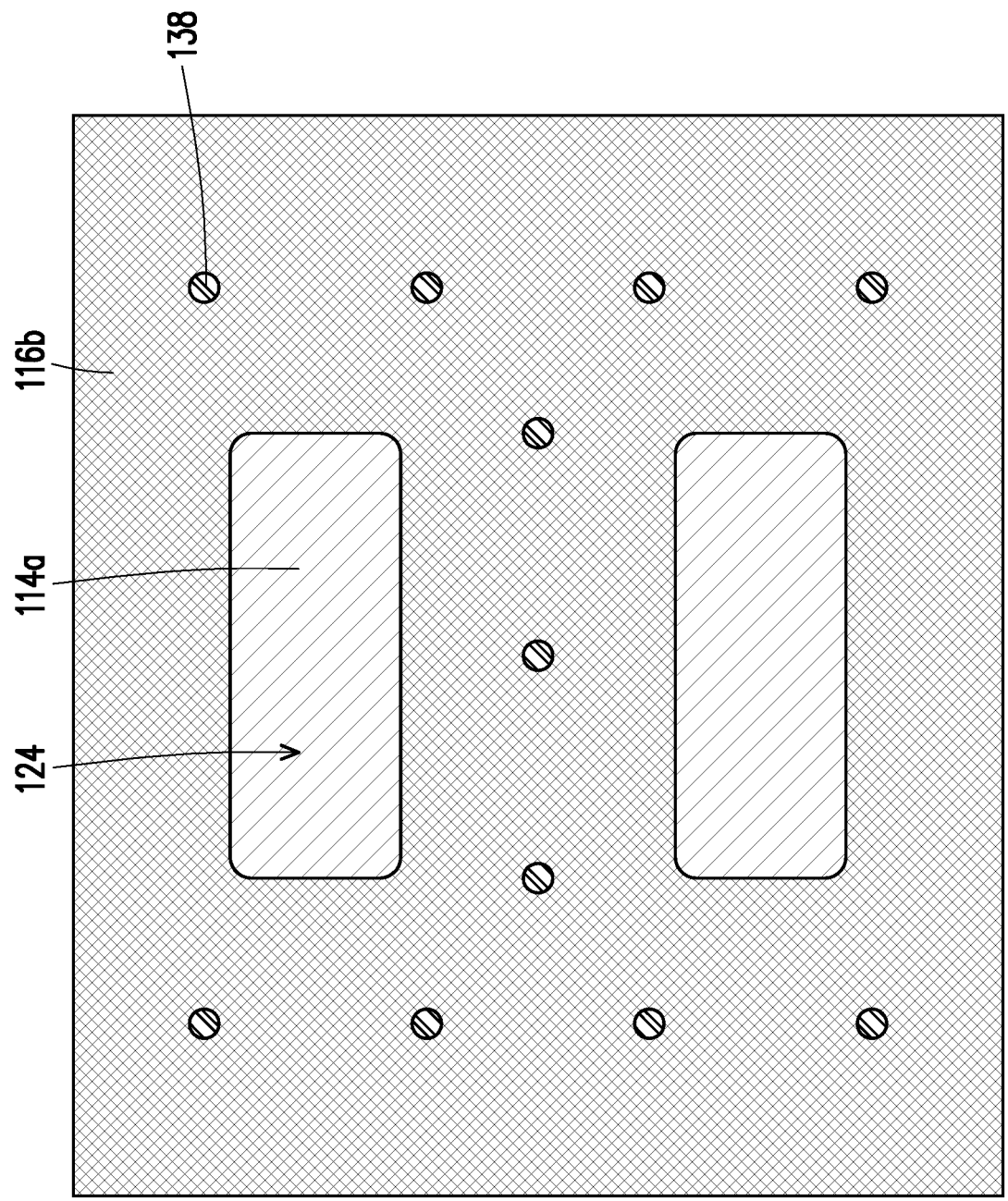
Figure 3E:
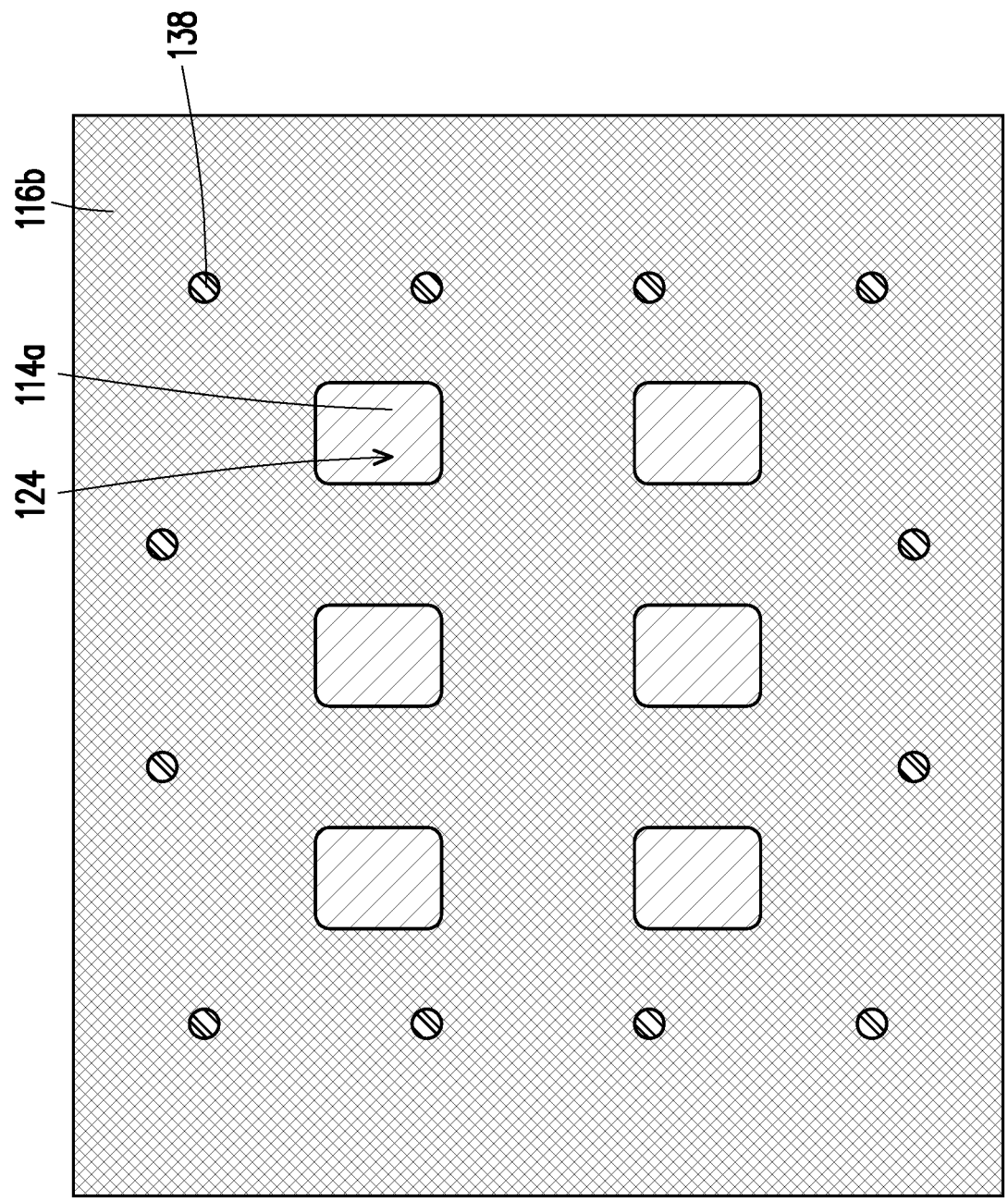
Figure 3F:
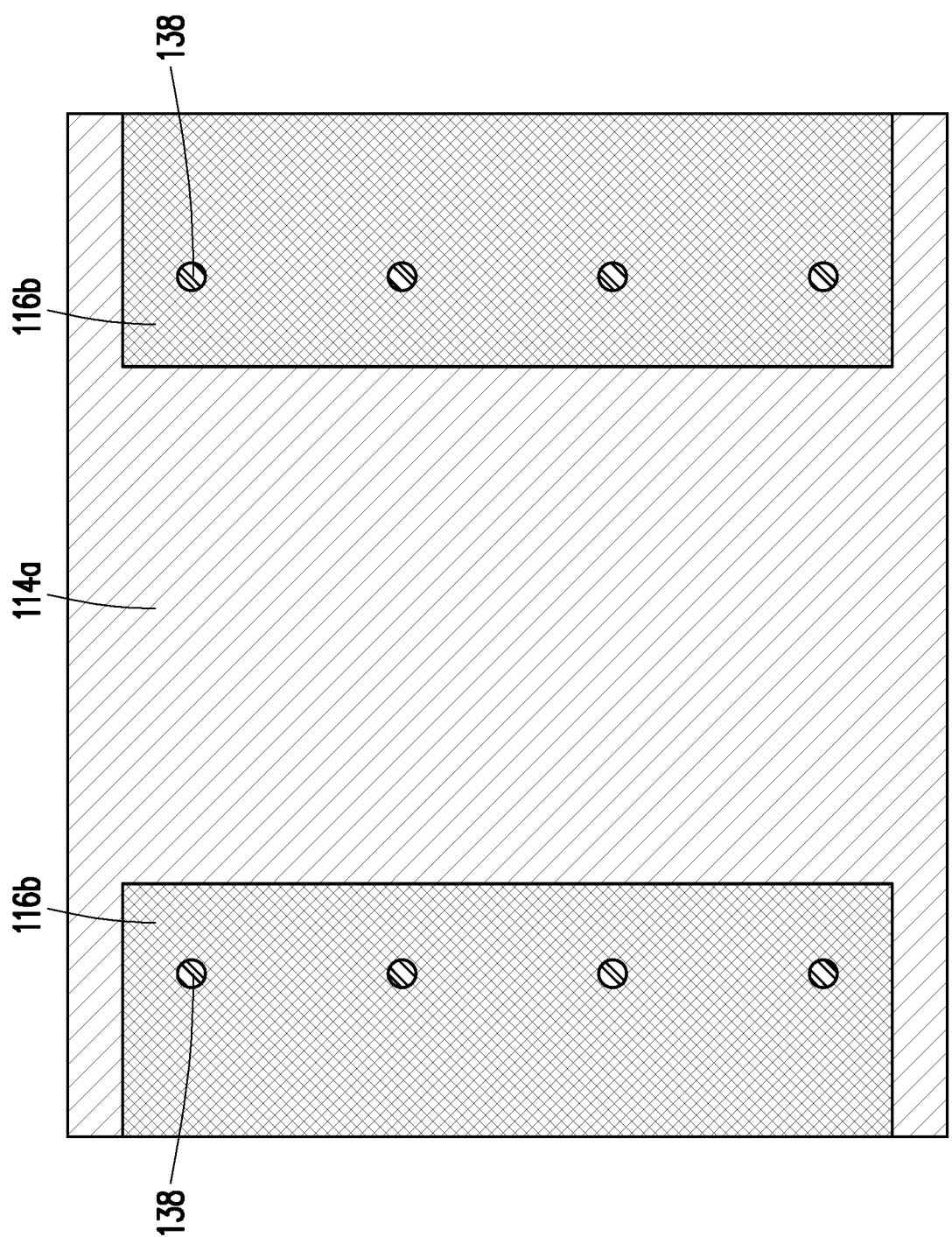
Figure 3G:
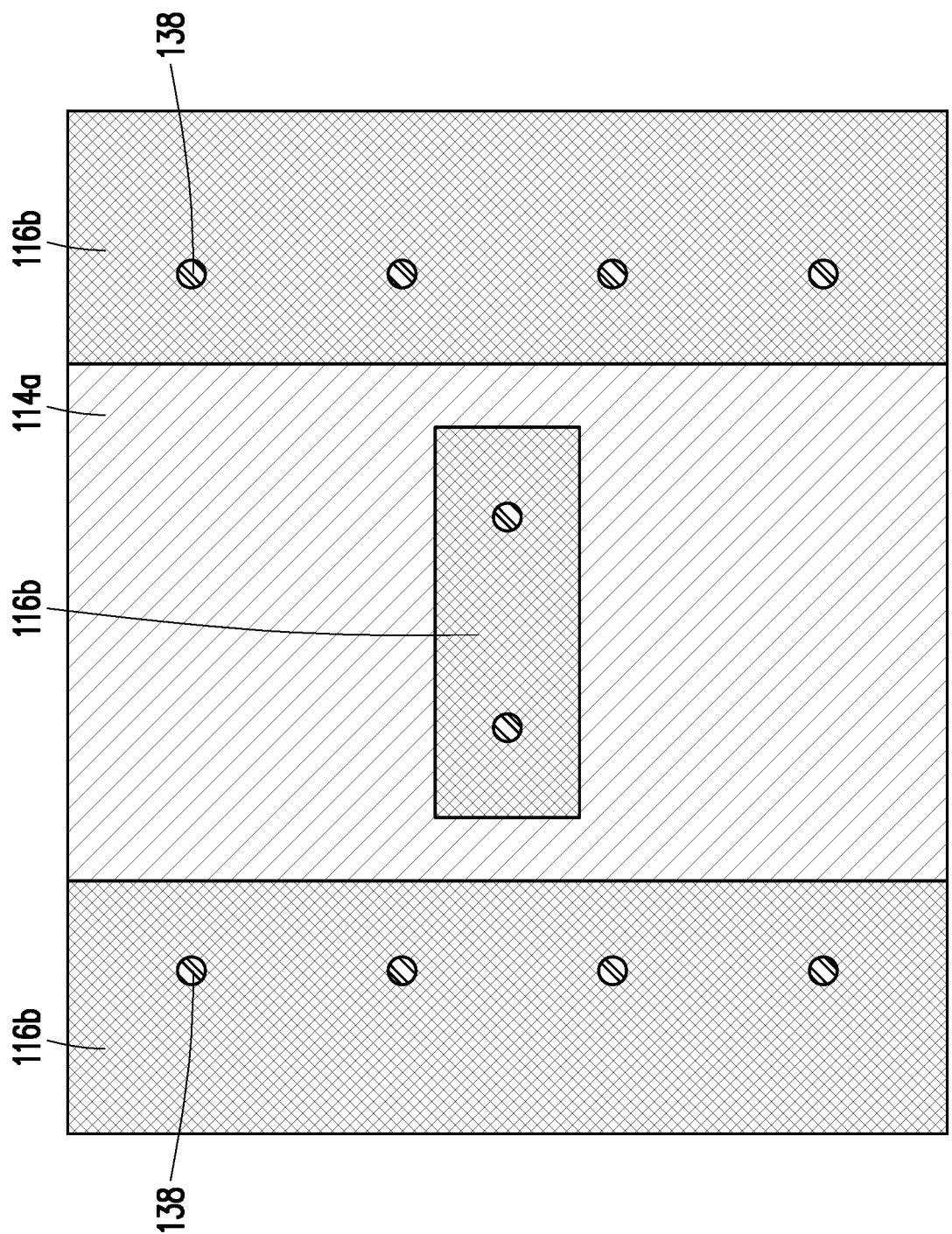

FIG. 3A is a top view illustrating the metal layer, the contact, and the conductive layer in FIG. 2G. FIG. 3B to FIG. 3G are top views illustrating the metal layer, the contact, and the conductive layer according to other embodiments of the invention.

Referring to FIG. 3A to FIG. 3G, the metal layer 116b exposes a portion of the conductive layer 114a. The metal layer 116b may have at least one opening 124, and the opening 124 exposes a portion of the conductive layer 114a. The shape of the opening 124 may be a rectangle (FIG. 3A, FIG. 3D, and FIG. 3E), an ellipse (FIG. 3B), a circle (FIG. 3C), or a combination thereof, but the invention is not limited thereto. As long as the metal layer 116b exposes a portion of the conductive layer 114a and the contact 138 may be located directly above the metal layer 116b, it falls within the scope of the invention.

Figure 4:
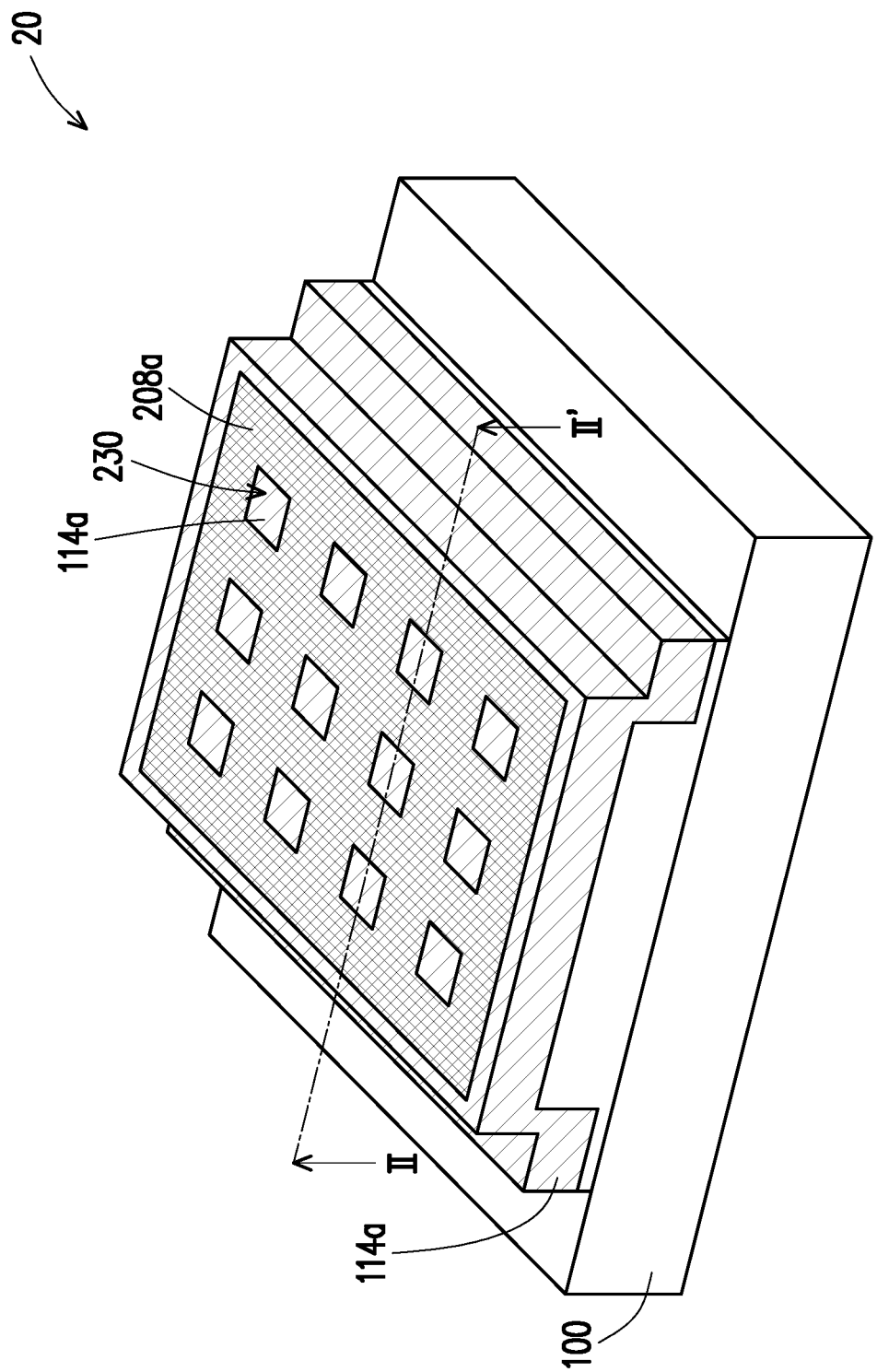
FIG. 4 is a perspective view illustrating a semiconductor device according to another embodiment of the invention.

FIG. 4 is a perspective view illustrating a semiconductor device according to another embodiment of the invention. FIG. 5A to FIG. 5H are cross-sectional views illustrating the manufacturing process of the semiconductor device taken along section line II-II' in FIG. 4. In FIG. 4, some components in FIG. 5A to FIG. 5H are omitted to clearly illustrate the arrangement relationship between the components in FIG. 4. FIG. 5A to FIG. 5H are cross-sectional views illustrating the manufacturing process subsequent to the step of FIG. 2A.

Figure 5A:
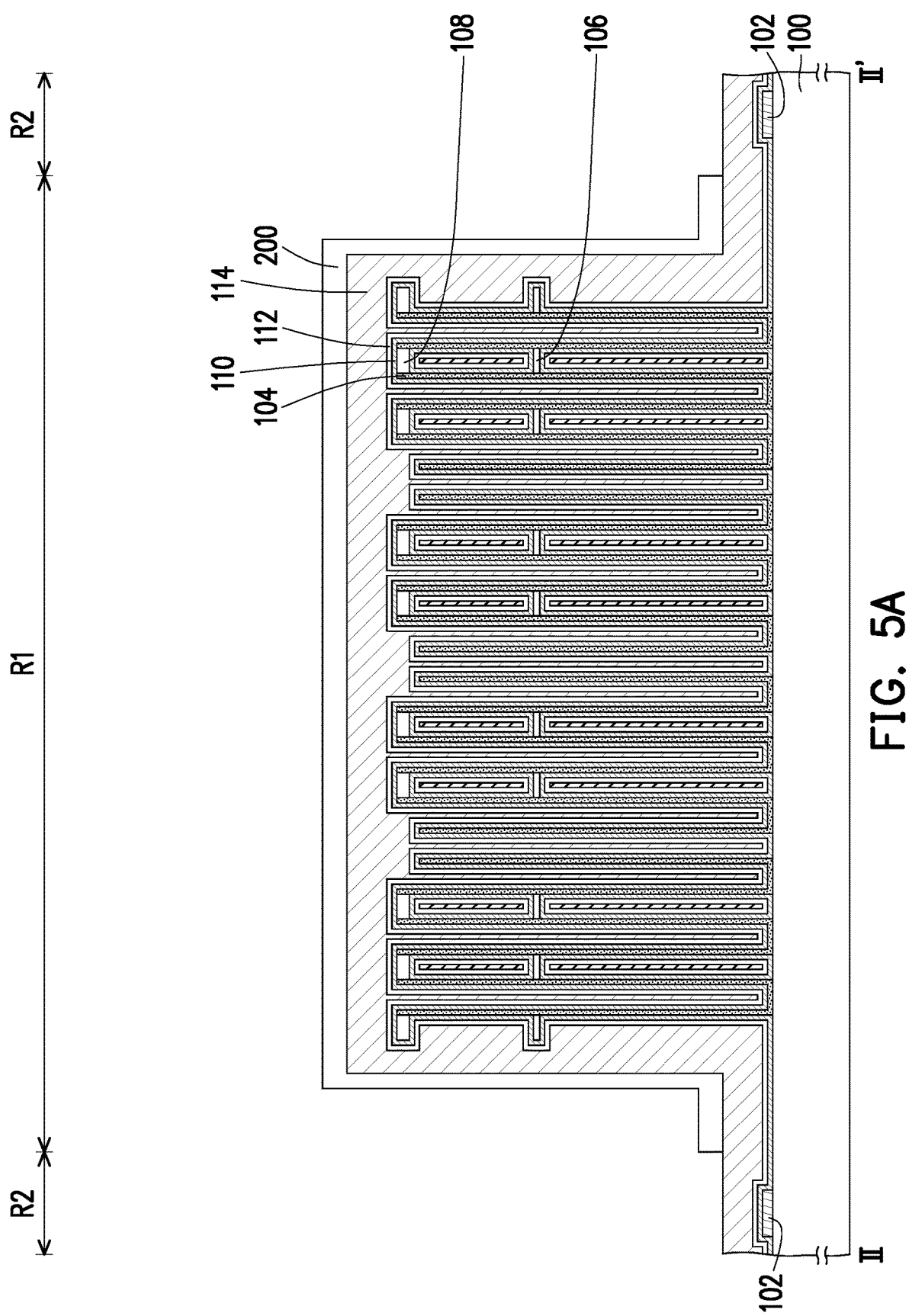
FIG. 5A to FIG. 5H are cross-sectional views illustrating the manufacturing process of the semiconductor device taken along section line II-II' in FIG. 4.

Referring to FIG. 5A, a dielectric layer 200 may be formed on the conductive material layer 114. The dielectric layer 200 may expose a portion of the conductive material layer 114 and may be used as a hard mask layer. The material of the dielectric layer 200 is, for example, silicon oxide such as tetraethyl orthosilicate (TEOS) silicon oxide.

Figure 5B:
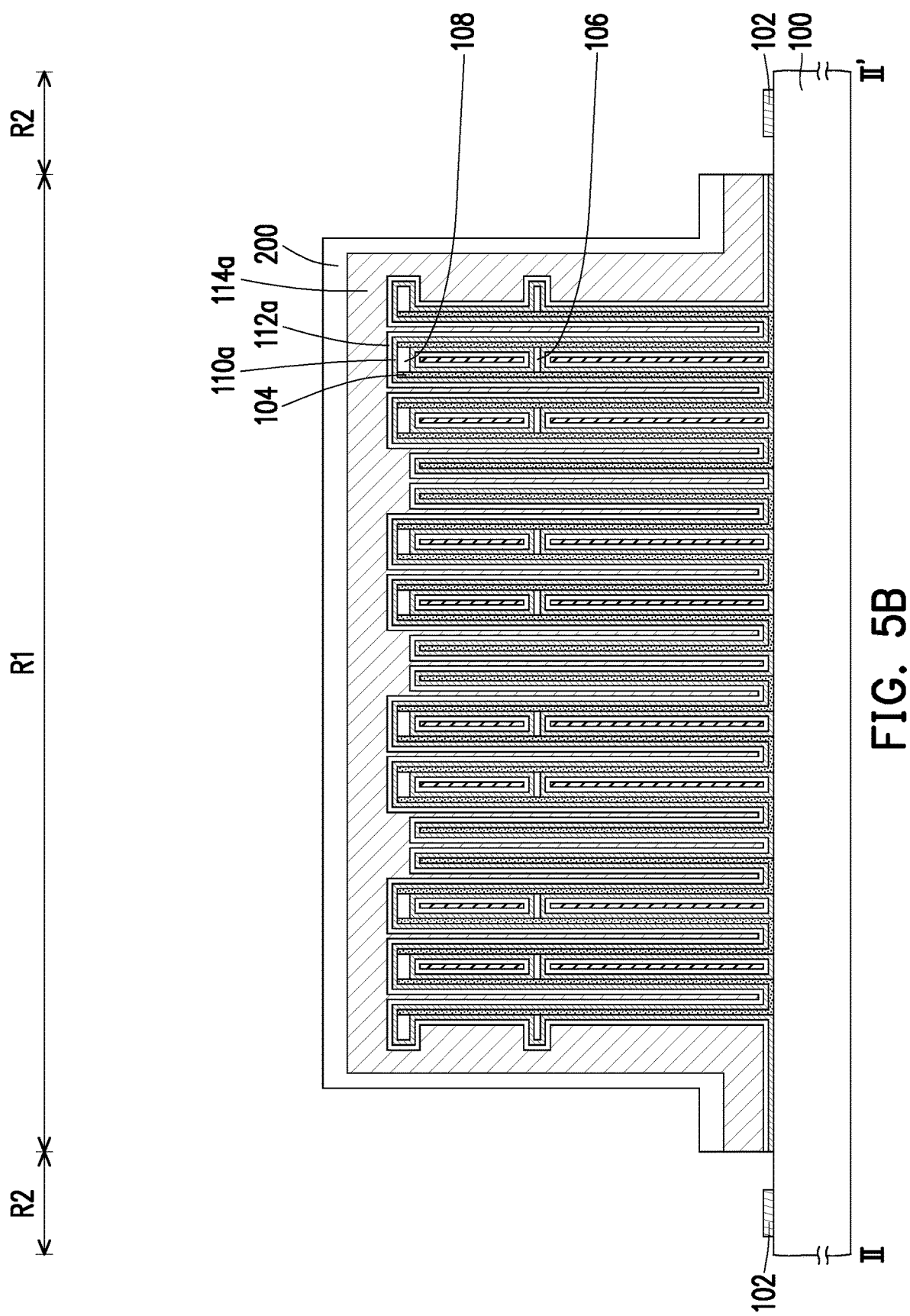

Referring to FIG. 5B, a portion of the conductive material layer 114, a portion of the conductive material layer 112, and a portion of the insulating material layer 110 in the peripheral circuit region R2 are removed by using the dielectric layer 200 as a mask, thereby forming an insulating layer 110a on the electrode 104, forming a conductive layer 112a on the insulating layer 110a, and forming a conductive layer 114a on the conductive layer 112a.

Figure 5C:
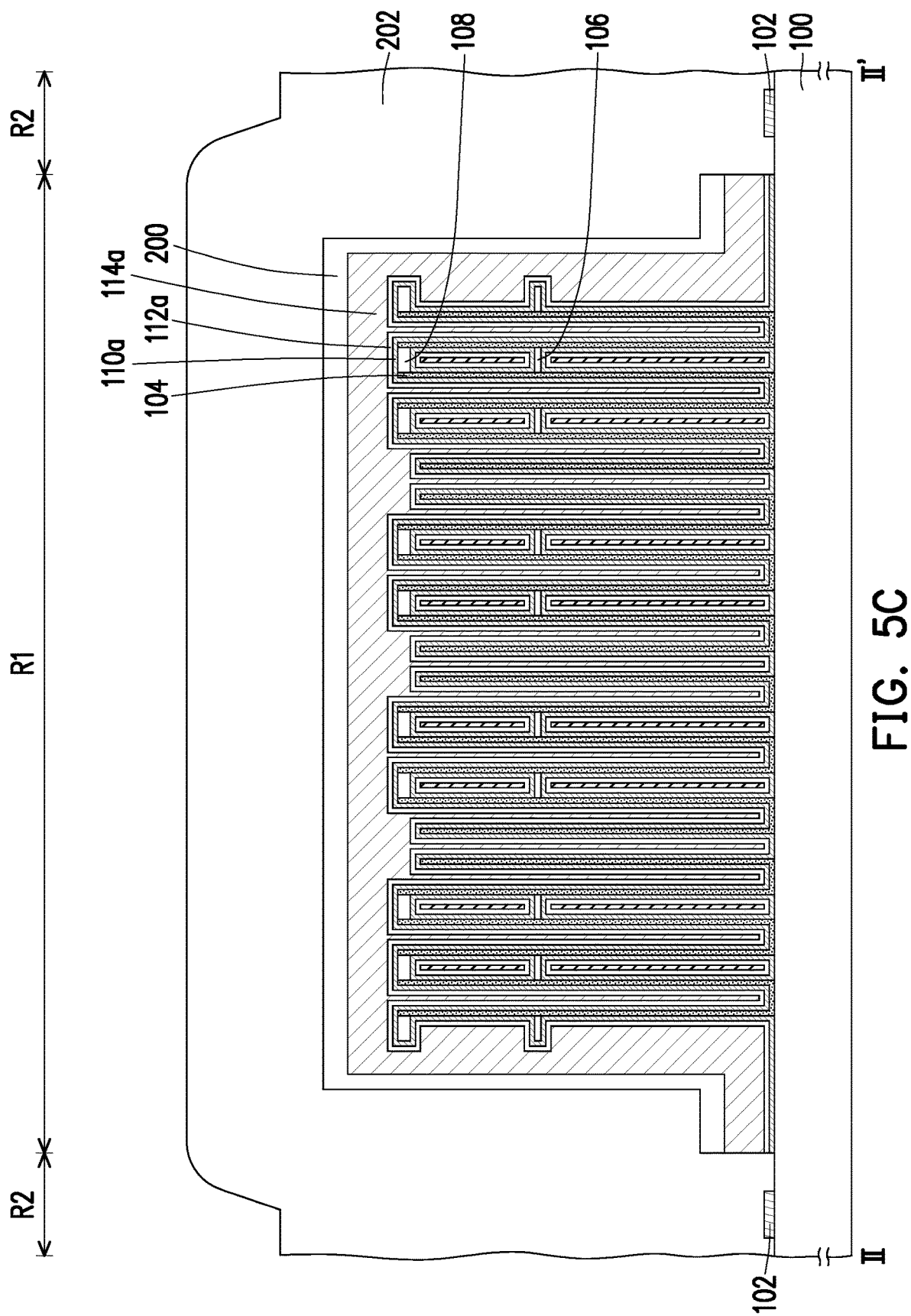

Referring to FIG. 5C, a dielectric layer 202 covering the dielectric layer 200 and the interconnect structure 102 may be formed. The material of the dielectric layer 202 is, for example, silicon oxide such as tetraethyl orthosilicate (TEOS) silicon oxide.

Figure 5D:
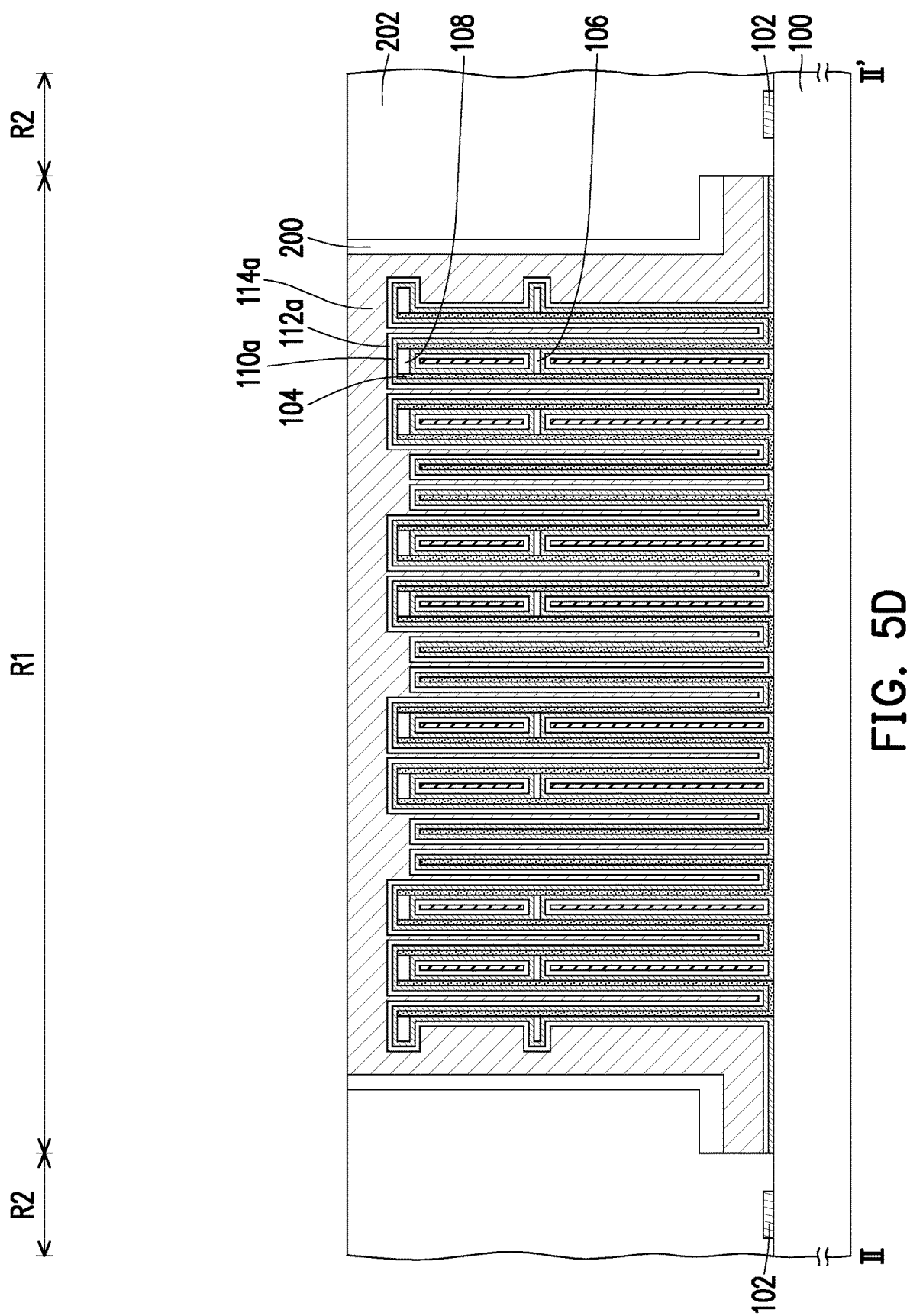

Referring to FIG. 5D, a portion of the dielectric layer 202 and a portion of the dielectric layer 200 may be removed to expose the conductive layer 114a. The method of removing a portion of the dielectric layer 202 and a portion of the dielectric layer 200 is, for example, performing a planarization process by using an etching process and/or a chemical mechanical polishing process, but the invention is not limited thereto.

Figure 5E:
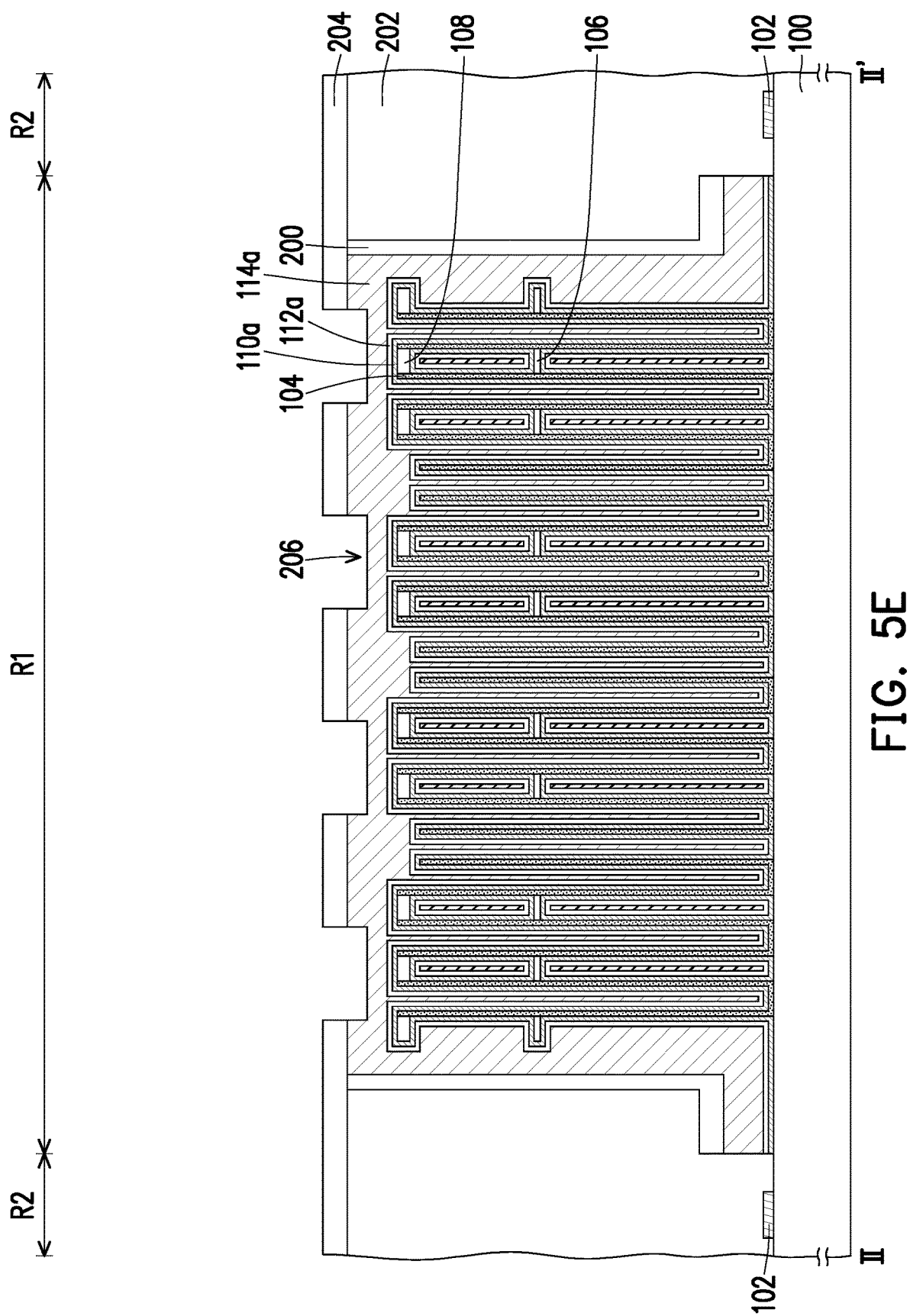

Referring to FIG. 5E, a patterned photoresist layer 204 may be formed. A portion of the conductive layer 114a may be removed by using the patterned photoresist layer 204 as a mask to form a recess 206 in the conductive layer 114a.

Figure 5F:
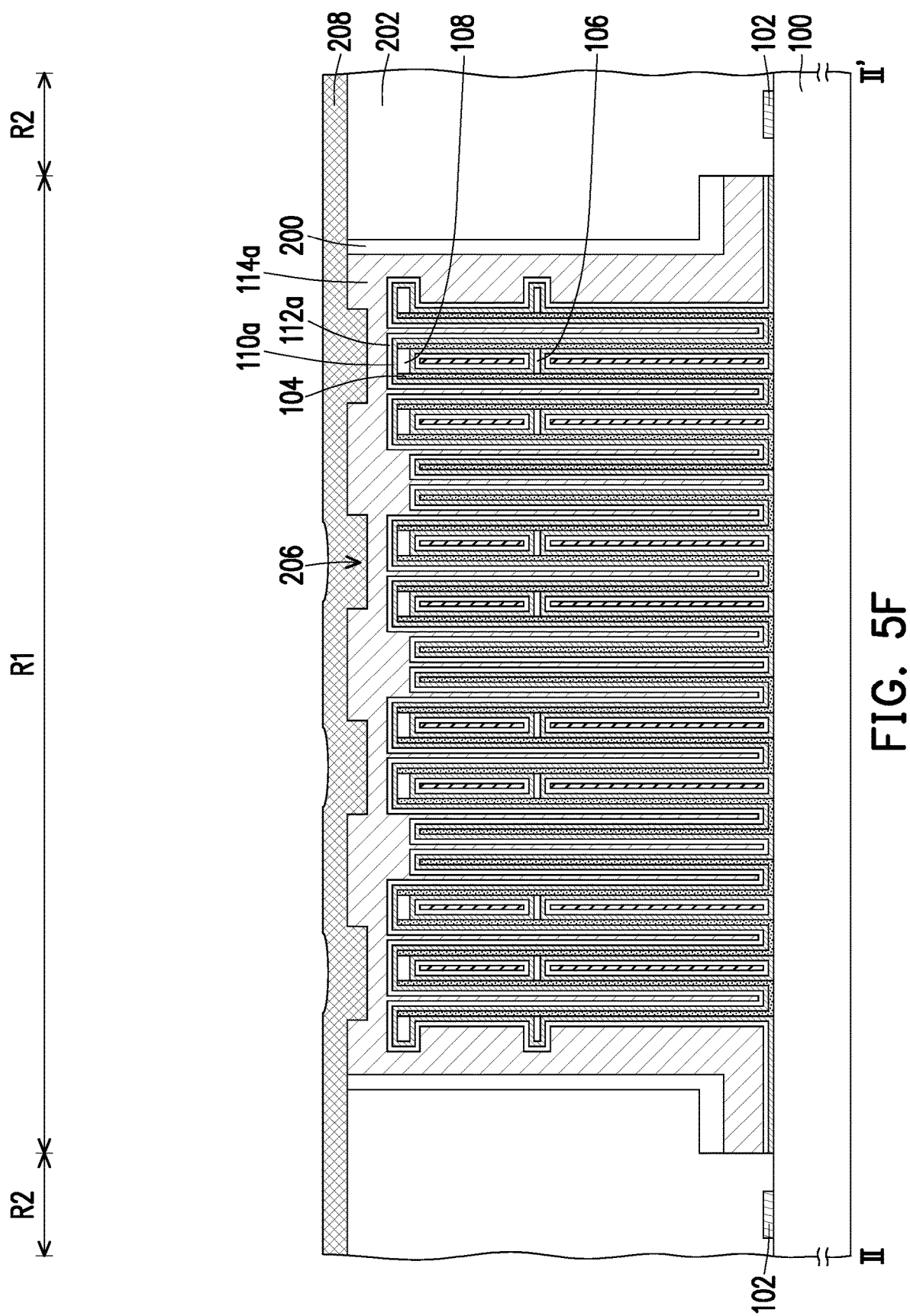

Referring to FIG. 5F, the patterned photoresist layer 204 may be removed. A metal material layer 208 filling the recess 206 may be directly formed on the conductive layer 114a. The material of the metal material layer 208 is, for example, metal such as tungsten.

Figure 5G:
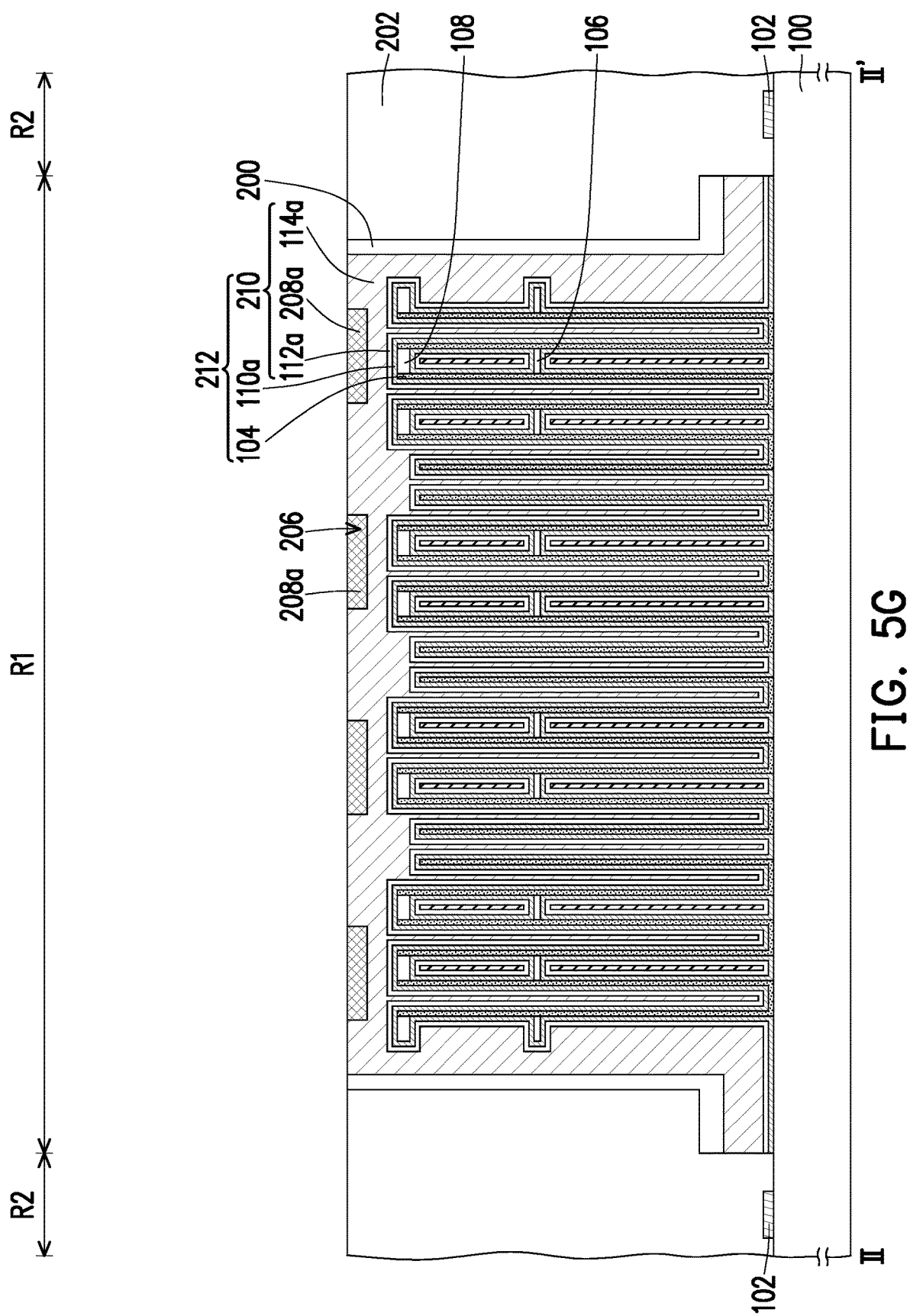

Referring to FIG. 5G, the metal material layer 208 outside the recess 206 is removed to form a metal layer 208a is formed in the recess 206, so that the metal layer 208a may expose a portion of the conductive layer 114a. In this way, the metal layer 208a may be formed on the conductive layer 114a. The method of removing the metal material layer 208 outside the recess 206 is, for example, an etch-back method, a chemical mechanical polishing method, or a combination thereof.

Through the above process, an electrode 210 may be formed on the insulating layer 110a, and a capacitor 212 may be formed in the memory array region R1, but the manufacturing method of the capacitor 212 of the invention is not limited thereto. The electrode 210 may include the conductive layer 114a, the metal layer 208a, and the conductive layer 112a. The capacitor 212 may include the electrode 104, the electrode 210, and the insulating layer 110a. The capacitor 212 may be a cylinder capacitor, but the invention is not limited thereto.

Figure 5H:
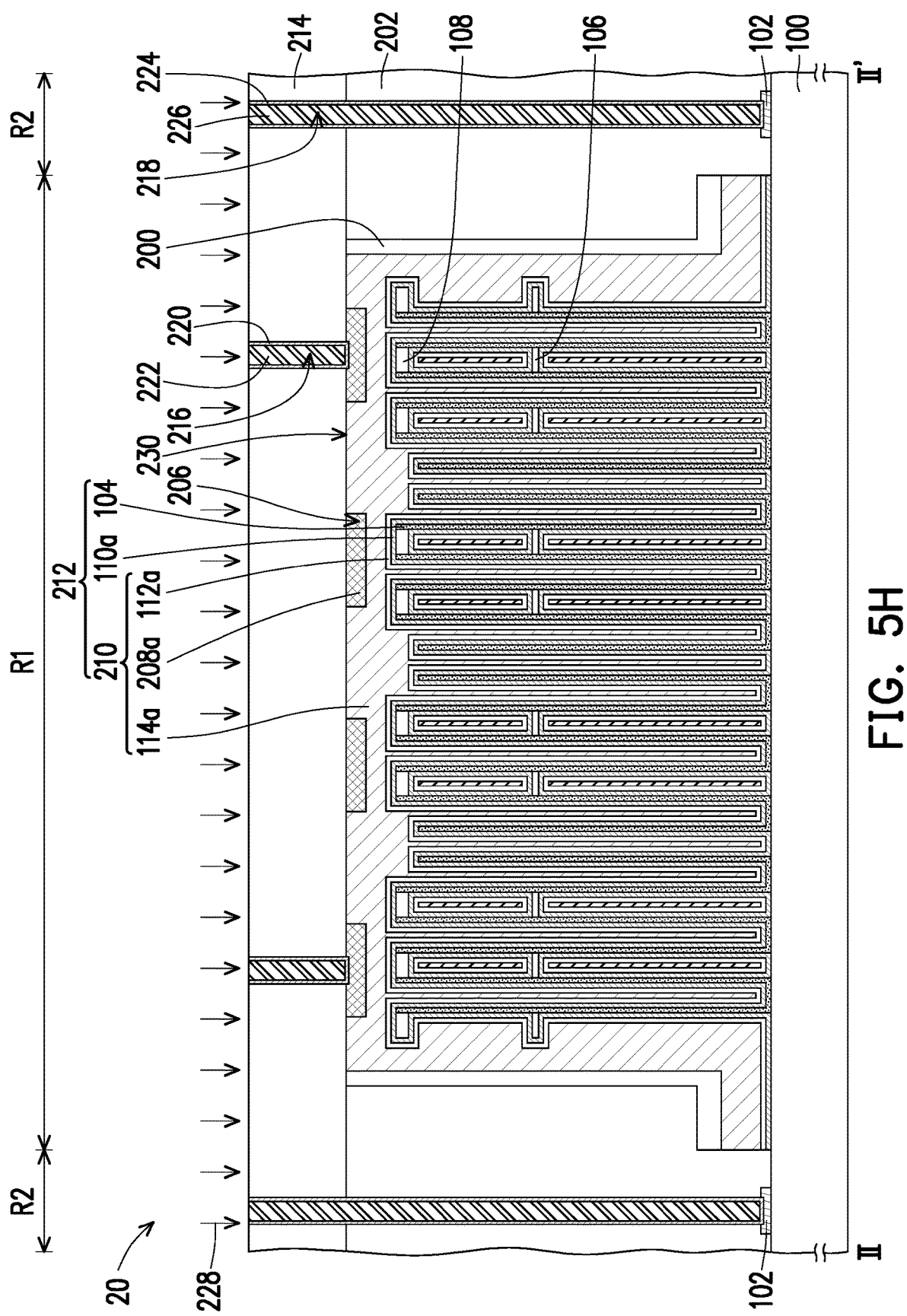

Referring to FIG. 5H, a dielectric layer 214 may be formed in the memory array region R1 and the peripheral circuit region R2. The material of the dielectric layer 214 is, for example, silicon oxide. An opening 216 exposing the capacitor 212 may be formed in the dielectric layer 214 of the memory array region R1, and an opening 218 exposing the interconnect structure 102 may be formed in the dielectric layer 214 and the dielectric layer 202 of the peripheral circuit region R2. For example, the opening 216 may expose the metal layer 208a in the capacitor 212. A barrier layer 220 and a contact 222 electrically connected to the metal layer 208a may be formed in the opening 216, and a barrier layer 224 and a contact 226 electrically connected to the interconnect structure 102 may be formed in the opening 218. The method of forming the opening 216, the opening 218, the barrier layer 220, the contact 222, the barrier layer 224, and the contact 226 may refer to the method of forming the opening 132, the opening 134, the barrier layer 136, the contact 138, the barrier layer 140, and the contact 142 in FIG. 2F and FIG. 2G, and the description thereof is omitted here.

Then, a hydrogen sintering treatment 228 may be performed, so that the dangling bonds on the substrate 100 can be reduced, thereby improving the electrical performance of the semiconductor device. In some embodiments, the hydrogen sintering treatment 228 may be performed after performing the back-end-of-line (BEOL) process.

Hereinafter, the semiconductor device 20 of the above embodiment will be described with reference to FIG. 4 and FIG. 5H. In addition, although the method of forming the semiconductor device 20 is described by taking the above method as an example, the invention is not limited thereto.

Referring to FIG. 4 and FIG. 5H, the semiconductor device 20 includes the substrate 100 and the capacitor 212. The substrate 100 may include the memory array region R1 and the peripheral circuit region R2. There is the interconnect structure 102 in the peripheral circuit region R2. The capacitor 212 is located in the memory array region R1 and includes the electrode 104, the electrode 210, and the insulating layer 110a. The electrode 104 is located on the substrate 100. The electrode 210 includes the conductive layer 114a and the metal layer 208a. The conductive layer 114a is located on the electrode 104. The metal layer 208a is located on the conductive layer 114a and may be located in the recess 206. The metal layer 208a may be in direct contact with the conductive layer 114a. The metal layer 208a exposes a portion of the conductive layer 114a. For example, the metal layer 208a may expose a portion of the top surface of the conductive layer 114a. The insulating layer 110a is located between the electrode 104 and the electrode 210. Furthermore, the electrode 210 may further include the conductive layer 112a. The conductive layer 112a is located between the conductive layer 114a and the insulating layer 110a.

Moreover, the semiconductor device 20 may further include at least one of the dielectric layer 200, the dielectric layer 202, the dielectric layer 214, the barrier layer 220, the contact 222, the barrier layer 224, and the contact 226. The dielectric layer 200 is located on the sidewall of the capacitor 212. The dielectric layer 202 covers the interconnect structure 102. The dielectric layer 214 covers the capacitor 212 and the dielectric layer 202. The barrier layer 220 and the contact 222 are located in the memory array region R1 and electrically connected to the metal layer 208a. The barrier layer 220 may be located in the opening 216, and the contact 222 may be located on the barrier layer 220 in the opening 216. The barrier layer 224 and the contact 226 are located in the peripheral circuit region R2 and electrically connected to the interconnect structure 102. The barrier layer 224 may be located in the opening 218, and the contact 226 may be located on the barrier layer 224 in the opening 218.

In addition, the metal layer 208a may have at least one opening 230, and the opening 230 exposes a portion of the conductive layer 114a. The quantity of openings 230 may be adjusted according to requirements and is not limited to the quantity in FIG. 5H. The shape and the arrangement of the metal layer 208a and the opening 230 may refer to the shape and the arrangement of the metal layer 116a and the opening 124 in FIG. 3A to FIG. 3G, and the description thereof is omitted here.

Figure 6:
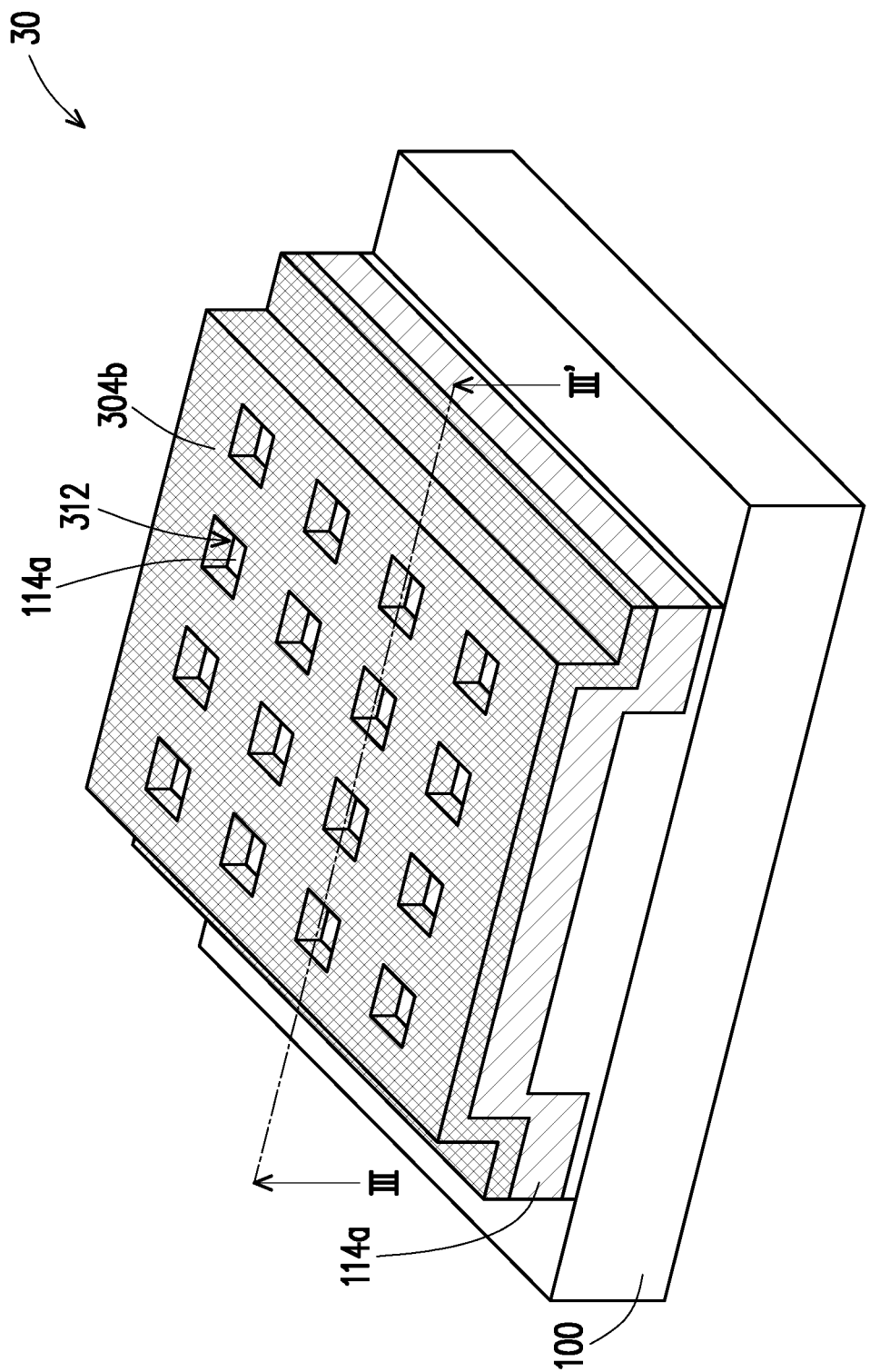
FIG. 6 is a perspective view illustrating a semiconductor device according to another embodiment of the invention.

FIG. 6 is a perspective view illustrating a semiconductor device according to another embodiment of the invention. FIG. 7A to FIG. 7E are cross-sectional views illustrating the manufacturing process of the semiconductor device taken along section line III-III' in FIG. 6. In FIG. 6, some components in FIG. 7A to FIG. 7E are omitted to clearly illustrate the arrangement relationship between the components in FIG. 6. FIG. 7A to FIG. 7E are cross-sectional views illustrating the manufacturing process subsequent to the step of FIG. 2A.

Figure 7A:
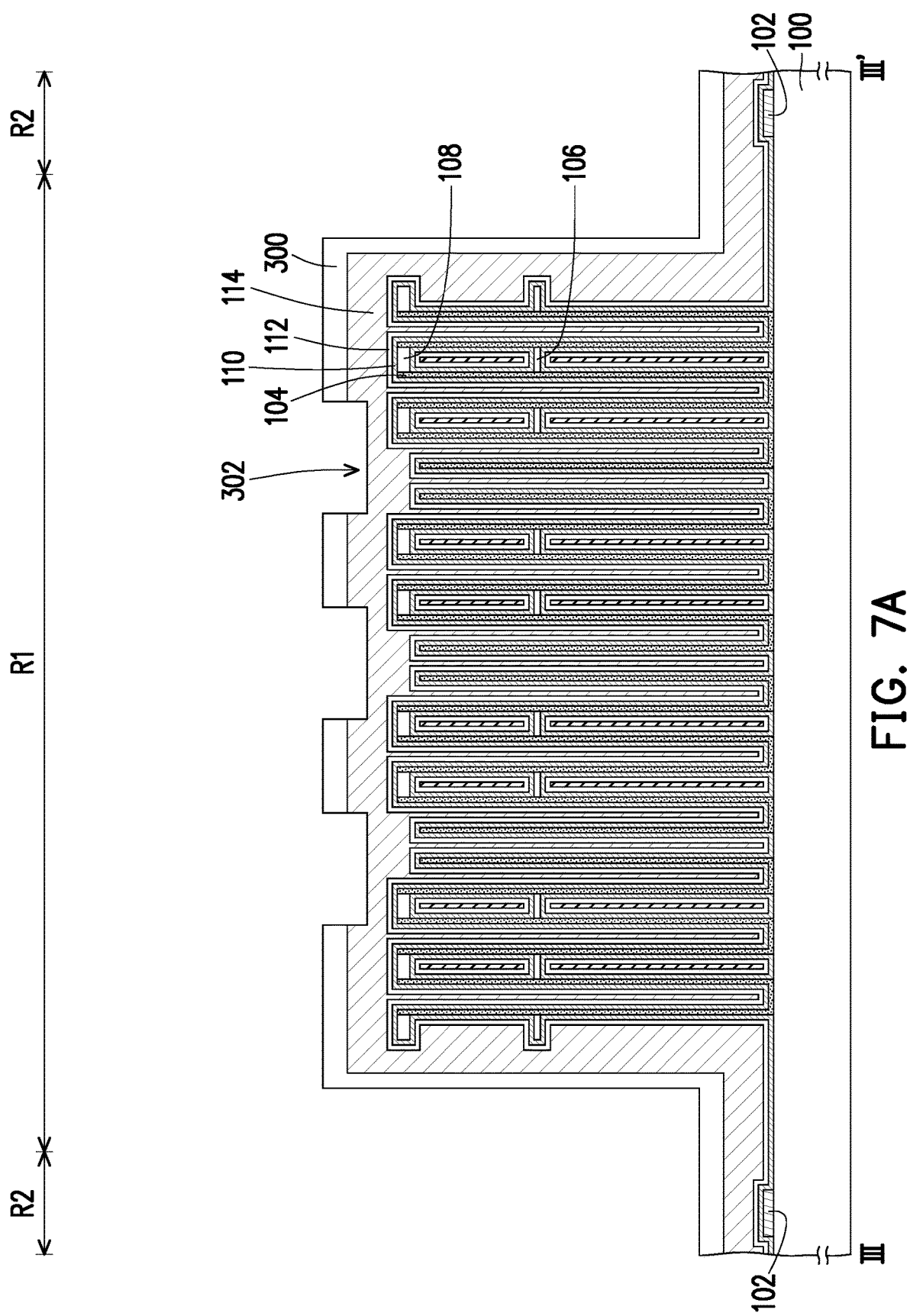
FIG. 7A to FIG. 7E are cross-sectional views illustrating the manufacturing process of the semiconductor device taken along section line III-III' in FIG. 6.

Referring to FIG. 7A, a patterned photoresist layer 300 may be formed on the conductive material layer 114. A portion of the conductive material layer 114 may be removed by using the patterned photoresist layer 300 as a mask to form a recess 302 in the conductive material layer 114.

Figure 7B:
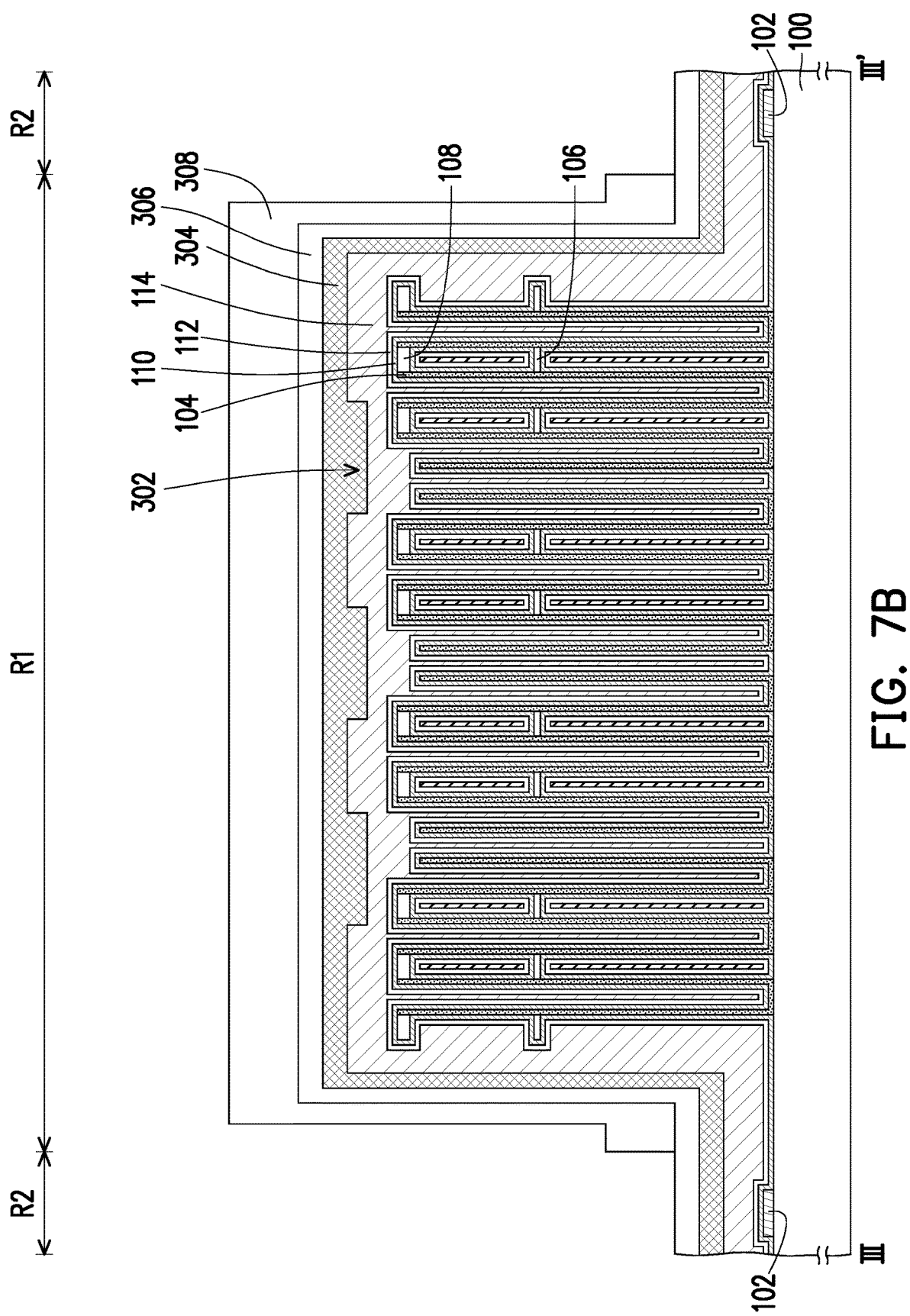

Referring to FIG. 7B, the patterned photoresist layer 300 may be removed. A metal material layer 304 filling the recess 302 may be formed directly on the conductive material layer 114. The material of the metal material layer 304 is, for example, metal such as tungsten. A dielectric layer 306 may be formed on the metal material layer 304. The material of the dielectric layer 306 is, for example, silicon oxide such as tetraethyl orthosilicate (TEOS) silicon oxide. A patterned photoresist layer 308 may be formed on the dielectric layer 306. The patterned photoresist layer 308 exposes a portion of the dielectric layer 306.

Figure 7C:
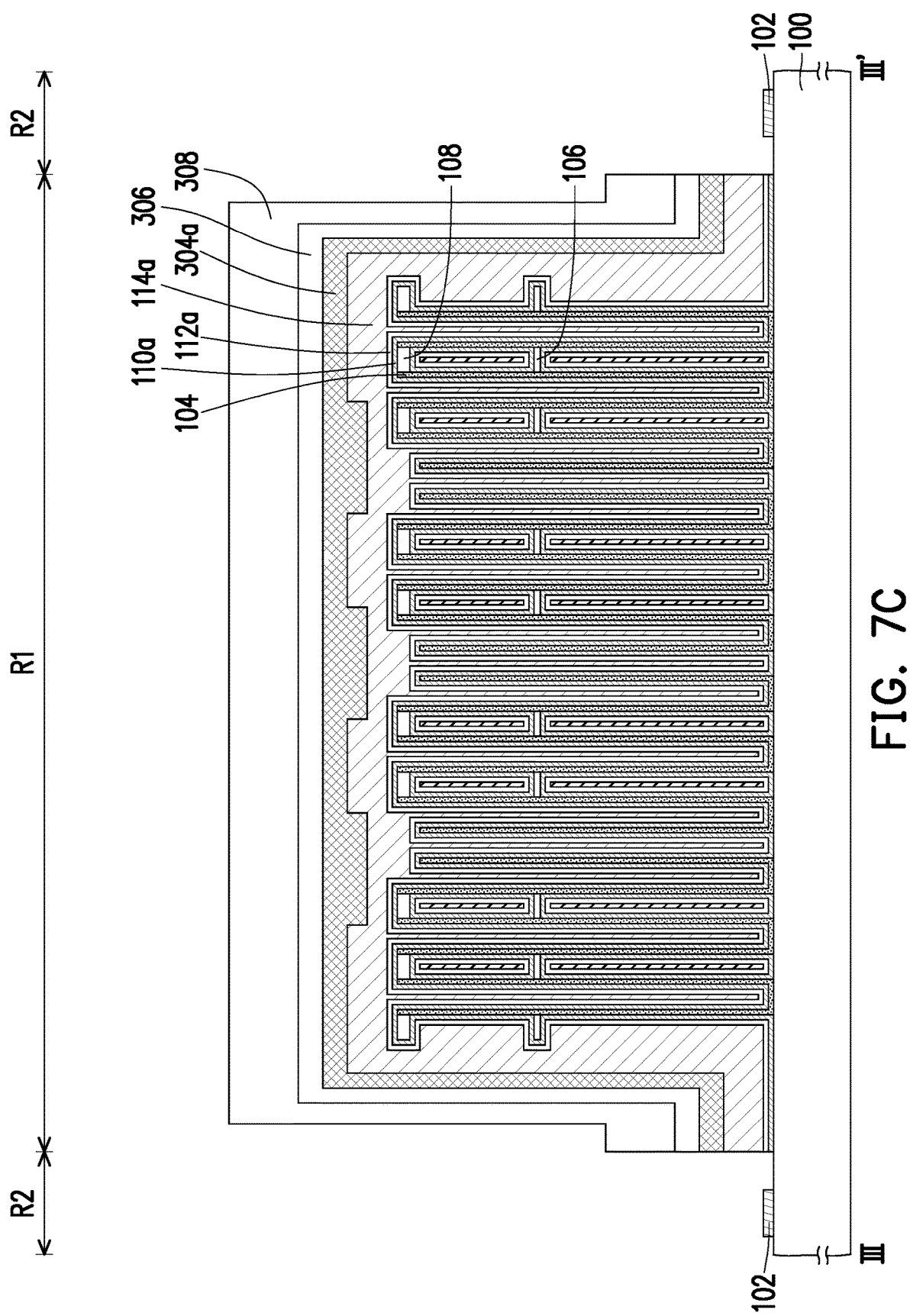

Referring to FIG. 7C, a patterning process is performed on the dielectric layer 306, the metal material layer 304, the conductive material layer 114, the conductive material layer 112, and the insulating material layer 110 by using the patterned photoresist layer 308 as a mask to remove a portion of the dielectric layer 306, a portion of the metal material layer 304, a portion of the conductive material layer 114, a portion of the conductive material layer 112, and a portion of the insulating material layer 110 in the peripheral circuit region R2, so that an insulating layer 110a is formed on the electrode 104, a conductive layer 112a is formed on the insulating layer 110a, a conductive layer 114a is formed on the conductive layer 112a, and a metal material layer 304a is formed on the conductive layer 114a.

Figure 7D:
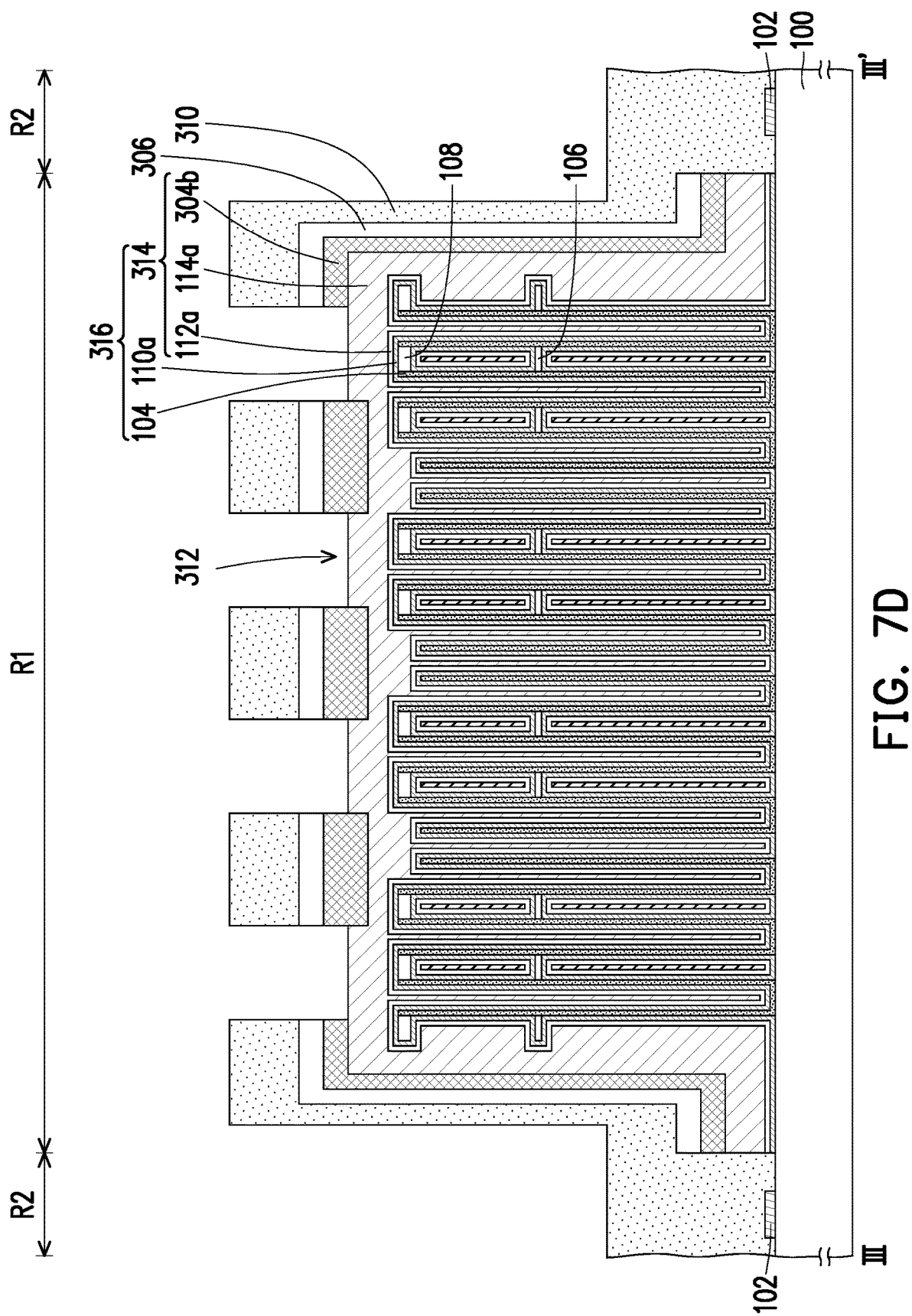

Referring to FIG. 7D, the patterned photoresist layer 308 may be removed. A patterned photoresist layer 310 may be formed. A portion of the dielectric layer 306 and a portion of the metal material layer 304a may be removed by using the patterned photoresist layer 310 as a mask. Thereby, a patterning process may be performed on the metal material layer 304a to form a metal layer 304b exposing a portion of the conductive layer 114a. In this way, the metal layer 304b may be formed on the conductive layer 114a. For example, after the above process is performed, the metal layer 304b may have at least one opening 312, and the opening 312 exposes a portion of the conductive layer 114a.

Through the above process, an electrode 314 may be formed on the insulating layer 110a, and a capacitor 316 may be formed in the memory array region R1, but the manufacturing method of the capacitor 316 of the invention is not limited thereto. The electrode 314 may include the conductive layer 114a, the metal layer 304b, and the conductive layer 112a. The capacitor 316 may include the electrode 104, the electrode 314, and the insulating layer 110a. The capacitor 316 may be a cylinder capacitor, but the invention is not limited thereto.

Figure 7E:
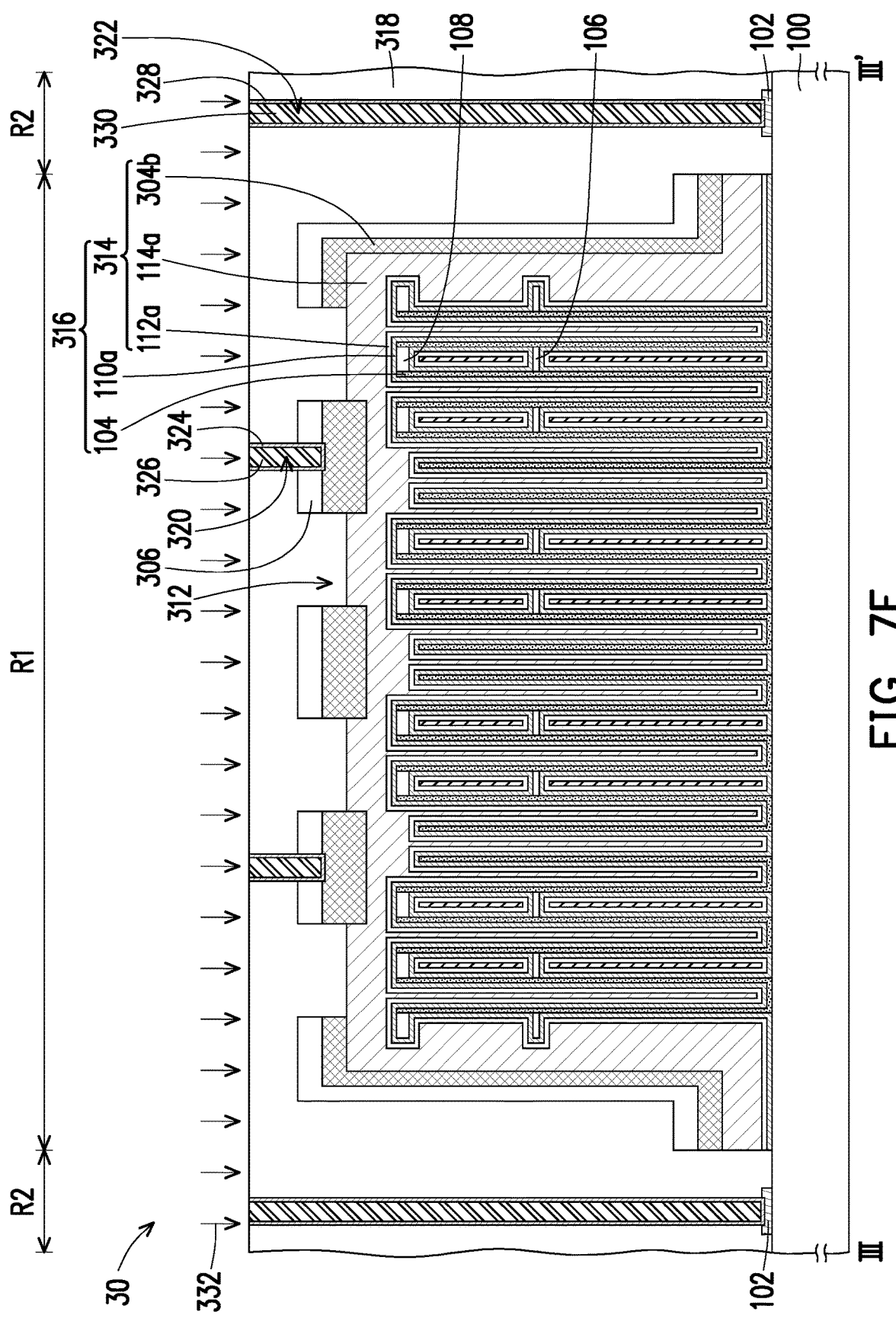

Referring to FIG. 7E, the patterned photoresist layer 310 may be removed. A dielectric layer 318 may be formed in the memory array region R1 and the peripheral circuit region R2, and the dielectric layer 318 may fill with the opening 312. An opening 320 exposing the capacitor 316 may be formed in the dielectric layer 318 and the dielectric layer 306 of the memory array region R1, and an opening 322 exposing the interconnect structure 102 may be formed in the dielectric layer 318 of the peripheral circuit region R2. For example, the opening 320 may expose the metal layer 304b in the capacitor 316. A barrier layer 324 and a contact 326 electrically connected to the metal layer 304b may be formed in the opening 320, and a barrier layer 328 and a contact 330 electrically connected to the interconnect structure 102 may be formed in the opening 322. The method of forming the dielectric layer 318, the opening 320, the opening 322, the barrier layer 324, the contact 326, the barrier layer 328, and the contact 330 may refer to the method of forming the dielectric layer 130, the opening 132, the opening 134, the barrier layer 136, the contact 138, the barrier layer 140, and the contact 142 in FIG. 2E to FIG. 2G, and the description thereof is omitted here.

Then, a hydrogen sintering treatment 332 may be performed, so that the dangling bonds on the substrate 100 can be reduced, thereby improving the electrical performance of the semiconductor device. In some embodiments, the hydrogen sintering treatment 332 may be performed after performing the back-end-of-line (BEOL) process.

Hereinafter, the semiconductor device 30 of the above embodiment will be described with reference to FIG. 6 and FIG. 7E. In addition, although the method of forming the semiconductor device 30 is described by taking the above method as an example, the invention is not limited thereto.

Referring to FIG. 6 and FIG. 7E, the semiconductor device 30 includes the substrate 100 and the capacitor 316. The substrate 100 may include the memory array region R1 and the peripheral circuit region R2. There is the interconnect structure 102 in the peripheral circuit region R2. The capacitor 316 is located in the memory array region R1 and includes the electrode 104, the electrode 314, and the insulating layer 110a. The electrode 104 is located on the substrate 100. The electrode 314 includes the conductive layer 114a and the metal layer 304b. The conductive layer 114a is located on the electrode 104. The metal layer 304b is located on the conductive layer 114a. The metal layer 304b may be in direct contact with the conductive layer 114a. The metal layer 304b exposes a portion of the conductive layer 114a. For example, the metal layer 304b may expose a portion of the top surface of the conductive layer 114a. In addition, a portion of the metal layer 304b may be located in the conductive layer 114a. The metal layer 304b may be located on the top surface and the side surface of the conductive layer 114a. The insulating layer 110a is located between the electrode 104 and the electrode 314. Furthermore, the electrode 314 may further include the conductive layer 112a. The conductive layer 112a is located between the conductive layer 114a and the insulating layer 110a.

Moreover, the semiconductor device 30 may further include at least one of the dielectric layer 306, the dielectric layer 318, the barrier layer 324, the contact 326, the barrier layer 328, and the contact 330. The dielectric layer 306 is located on the metal layer 304b. The dielectric layer 318 covers the capacitor 316 and the interconnect structure 102. The barrier layer 324 and the contact 326 are located in the memory array region R1 and electrically connected to the metal layer 304b. The barrier layer 324 may be located in the opening 320, and the contact 326 may be located on the barrier layer 324 in the opening 320. The barrier layer 328 and the contact 330 are located in the peripheral circuit region R2 and electrically connected to the interconnect structure 102. The barrier layer 328 may be located in the opening 322, and the contact 330 may be located on the barrier layer 328 in the opening 322.

In addition, the metal layer 304b may have at least one opening 312, and the opening 312 exposes a portion of the conductive layer 114a. The quantity of openings 312 may be adjusted according to requirements and is not limited to the quantity in FIG. 7E. The shape and the arrangement of the metal layer 304b and the opening 312 may refer to the shape and the arrangement of the metal layer 116a and the opening 124 in FIG. 3A to FIG. 3G, and the description thereof is omitted here.

Based on the above embodiments, in the semiconductor device (10, 20, or 30) and the manufacturing method thereof, since the metal layer (116b, 208a, or 304b) exposes the conductive layer (114a), that is, the metal layer (116b, 208a, or 304b) does not completely cover the conductive layer (114a), the subsequent hydrogen sintering treatment (144, 228 or 332) can be smoothly performed to improve the electrical performance of the semiconductor device (10, 20, or 30). In addition, since the metal layer (116b, 208a, or 304b) can be used as an etching stop layer in the subsequent process for forming the contact (138, 222 or 326), there is no need to increase the thickness of the conductive layer (114a). In this way, the conductive layer (114a) can have better uniformity between different memory array regions (R1), thereby effectively improving the electrical performance of the semiconductor device (10, 20, or 30). Furthermore, the subsequently formed contact (138, 222 or 326) can be electrically connected to the metal layer (116b, 208a, or 304b) in the electrode (126, 210, or 314), so that the resistance between the contact (116b, 208a, or 304b) and the electrode (126, 210, or 314) can be reduced, thereby improving the electrical performance of the semiconductor device (10, 20, or 30).

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor device, comprising:
   a substrate comprising a memory array region; and
   a capacitor located in the memory array region and comprising:
   a first electrode located on the substrate;
   a second electrode comprising:
   a first conductive layer located on the first electrode; and
   a metal layer located on the first conductive layer, wherein the metal layer exposes a portion of the first conductive layer, the metal layer has openings, the openings expose the portion of the first conductive layer, and the openings are separated from each other; and an insulating layer located between the first electrode and the second electrode.

2. The semiconductor device according to claim 1, wherein a material of the first conductive layer comprises a doped semiconductor material.

3. The semiconductor device according to claim 1, wherein the metal layer is in direct contact with the first conductive layer.

4. The semiconductor device according to claim 1, wherein a shape of the openings comprises a polygon, an ellipse, a circle, or a combination thereof.

5. The semiconductor device according to claim 1, wherein the first conductive layer has a recess, the recess is located on a top surface of the first conductive layer, and the metal layer is located in the recess.

6. The semiconductor device according to claim 1, wherein the metal layer is located on a top surface and a side surface of the first conductive layer.

7. The semiconductor device according to claim 1, wherein the substrate further comprises a peripheral circuit region, there is an interconnect structure in the peripheral circuit region, and the semiconductor device further comprises:

a first contact located in the memory array region and electrically connected to the metal layer; and a second contact located in the peripheral circuit region and electrically connected to the interconnect structure.

8. The semiconductor device according to claim 7, wherein the interconnect structure and the metal layer are a same material.

9. The semiconductor device according to claim 1, wherein the second electrode further comprises:

a second conductive layer located between the first conductive layer and the insulating layer.

10. A manufacturing method of a semiconductor device, comprising:

providing a substrate, wherein the substrate comprises a memory array region; and forming a capacitor in the memory array region, wherein a method of forming the capacitor comprises:

forming a first electrode on the substrate of the memory array region;

forming an insulating layer on the first electrode; and forming a second electrode on the insulating layer, wherein a method of forming the second electrode comprises:

forming a first conductive layer on the insulating layer; and forming a metal layer on the first conductive layer, wherein the metal layer exposes a portion of the first conductive layer, the metal layer has openings, the openings expose the portion of the first conductive layer, and the openings are separated from each other.

11. The manufacturing method of the semiconductor device according to claim 10, wherein a method of forming the metal layer comprises:

forming a metal material layer on the first conductive layer; and performing a patterning process on the metal material layer to form the metal layer exposing the portion of the first conductive layer.

12. The manufacturing method of the semiconductor device according to claim 10, wherein a method of forming the metal layer comprises:

forming a recess in the first conductive layer;

forming a metal material layer filling the recess on the first conductive layer; and removing the metal material layer outside the recess to form the metal layer in the recess.

13. The manufacturing method of the semiconductor device according to claim 12, wherein a method of removing the metal material layer outside the recess comprises an etch-back method, a chemical mechanical polishing method, or a combination thereof.

14. The manufacturing method of the semiconductor device according to claim 10, wherein a method of forming the first conductive layer and the metal layer comprises:

forming a conductive material layer;

forming a recess in the conductive material layer;

forming a metal material layer filling the recess on the conductive material layer;

performing a first patterning process on the conductive material layer to form the first conductive layer; and performing a second patterning process on the metal material layer to form the metal layer exposing the portion of the first conductive layer.

15. The manufacturing method of the semiconductor device according to claim 14, wherein the metal layer is located on a top surface and a side surface of the first conductive layer, and a portion of the metal layer is located in the first conductive layer.

16. The manufacturing method of the semiconductor device according to claim 10, wherein the substrate further comprises a peripheral circuit region, there is an interconnect structure in the peripheral circuit region, and the manufacturing method of the semiconductor device further comprises:

forming a dielectric layer in the memory array region and the peripheral circuit region;

forming a first opening exposing the capacitor in the dielectric layer of the memory array region, and forming a second opening exposing the interconnect structure in the dielectric layer of the peripheral circuit region; and forming a first contact electrically connected to the metal layer in the first opening, and forming a second contact electrically connected to the interconnect structure in the second opening.

17. The manufacturing method of the semiconductor device according to claim 16, wherein the interconnect structure and the metal layer are a same material.

18. The manufacturing method of the semiconductor device according to claim 16, further comprising:

performing a hydrogen sintering treatment after forming the first contact and the second contact.

19. The manufacturing method of the semiconductor device according to claim 10, wherein the method of forming the second electrode further comprises:

forming a second conductive layer on the insulating layer; and forming the first conductive layer on the second conductive layer.

* * * * *